US010311193B2

(12) United States Patent
Kalte et al.

(10) Patent No.: US 10,311,193 B2
(45) Date of Patent: Jun. 4, 2019

(54) ALTERATION OF A SIGNAL VALUE FOR AN FPGA AT RUNTIME

(71) Applicant: dSPACE digital signal processing and control engineering GmbH, Paderborn (DE)

(72) Inventors: Heiko Kalte, Paderborn (DE); Lukas Funke, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 21 days.

(21) Appl. No.: 14/823,197

(22) Filed: Aug. 11, 2015

(65) Prior Publication Data

US 2015/0347669 A1    Dec. 3, 2015

Related U.S. Application Data

(63) Continuation of application No. PCT/EP2014/052625, filed on Feb. 11, 2014.

(30) Foreign Application Priority Data

Feb. 11, 2013   (DE) ........................ 10 2013 101 300
Feb. 11, 2013   (EP) ..................................... 13154741

(51) Int. Cl.
*G06F 17/50*        (2006.01)
(52) U.S. Cl.
CPC ...... *G06F 17/5081* (2013.01); *G06F 17/5027* (2013.01); *G06F 17/5054* (2013.01)
(58) Field of Classification Search
CPC ............. G06F 17/5027; G06F 17/5054; G06F 17/5081
See application file for complete search history.

(56) References Cited

U.S. PATENT DOCUMENTS 5,425,036 A    6/1995   Liu et al.
6,292,762 B1   9/2001   Moll et al.
(Continued)

FOREIGN PATENT DOCUMENTS

CN       1818912 A      8/2006
CN     101493809 A      7/2009
(Continued)

OTHER PUBLICATIONS

Partial European Search Report for European Application No. 13154741.6 dated Jul. 11, 2013 with English translation.
(Continued)

*Primary Examiner* — Vuthe Siek
(74) *Attorney, Agent, or Firm* — Muncy, Geissler, Olds & Lowe, P.C.

(57) ABSTRACT

A method for changing a signal value of an FPGA at runtime, including the steps of loading an FPGA hardware configuration with at least one signal value onto the FPGA, running the FPGA hardware configuration on the FPGA, setting the signal value for transfer to the FPGA, determining writeback data from the signal value, writing the writeback data as status data to a configuration memory of the FPGA, and transferring the status data from the configuration memory to the functional level of the FPGA. A method is also provided for performing an FPGA build, including the steps of creating an FPGA hardware configuration with a plurality of signal values, arranging signal values in adjacent areas of the FPGA hardware configuration, ascertaining memory locations of a configuration memory for status data of the plurality of signal values on the basis of the FPGA hardware configuration, and creating a list containing signal values.

17 Claims, 16 Drawing Sheets

(56) References Cited

U.S. PATENT DOCUMENTS

| | | | |
|---|---|---|---|
| 6,453,456 | B1 | 9/2002 | Price |
| 6,922,665 | B1 | 7/2005 | Guccione et al. |
| 7,240,303 | B1 | 7/2007 | Schubert et al. |
| 7,546,572 | B1 | 6/2009 | Ballagh et al. |
| 7,689,726 | B1 | 3/2010 | Sundararajan et al. |
| 7,827,510 | B1 | 11/2010 | Schubert et al. |
| 8,250,503 | B2 | 8/2012 | Vorbach et al. |
| 8,352,229 | B1 | 1/2013 | Ma et al. |
| 8,930,876 | B2 | 1/2015 | Pell et al. |
| 2002/0010902 | A1 | 1/2002 | Chen et al. |
| 2003/0105620 | A1 | 6/2003 | Bowen |
| 2005/0209840 | A1 | 9/2005 | Baklashov et al. |
| 2006/0117274 | A1 | 6/2006 | Tseng et al. |
| 2006/0184350 | A1 | 8/2006 | Huang et al. |
| 2008/0005478 | A1* | 1/2008 | Lubbers .............. G06F 12/0804 711/135 |
| 2009/0019416 | A1 | 1/2009 | Chugh et al. |
| 2013/0055177 | A1* | 2/2013 | Chiu .................. G06F 17/5054 716/104 |

FOREIGN PATENT DOCUMENTS

| | | |
|---|---|---|
| CN | 102332307 A | 1/2012 |
| CN | 102520333 A | 6/2012 |
| CN | 102636744 A | 8/2012 |
| JP | 2009-031933 A | 2/2009 |
| WO | WO 01/91296 A2 | 11/2001 |
| WO | WO 02/44876 A2 | 6/2002 |

OTHER PUBLICATIONS

Advanced European Search Report for European Application No. 13154741.5 dated Aug. 26, 2013 with English translation.

German Office Action for German Application No. 10 2013 101 300.7 dated Sep. 17, 2013 with English translation.

International Search Report for PCT Application No. PCT/EP2014/052625 dated Sep. 18, 2014 with English translation.

International Searc Report for PCT Application No. PCT/EP2014/052625 dated Dec. 4, 2014 with English translation.

Aguirre, et al., "UNSHADES-1: An Advanced Tool for In-System Run-Time Hardware Debugging," Field Prog. Logic & App., pp. 1170-1173 (Jan. 1, 2003).

Tombs, et al., "Implementation of a FPGA Hardware Debugger System with Minimal System Overhead," Field Prog. Logic & App., pp. 1062-1066 (Jan. 1, 2004).

Aguirre, et al., "Improving the Design Process of VLSI Circuits by Means of a Hardware Debugging Systems: UNSHADES-1 Framework," Proc. of the 28$^{th}$ Annual Conf. of the IEEE (IECON-2002), pp. 2544-257 (Nov. 5, 2002).

Virtex Series Configuration Architecture User Guide, pp. 1-45 (Oct. 1, 2004).

Virtex FPGA Series Configuration and Readback, pp. 1-37 (Mar. 1, 2005).

Monmasson et al., "FPGAs in Industrial Control Applications," IEEE Trans. on Ind. Infomatics, vol. 7, No. 2, pp. 224-243 (May 2011).

XILINX Development System Reference Guide, pp. 1, 48, 333 and 482 (Jan. 31, 2012).

Paiz, et al., "FPGA-in-the-Loop-Simulations for Dynamically Reconfigurable Applications," IEEE Apps in Field-Prog. Tech., pp. 372-375 (2009).

Graham, et al., "Improving the FPGA Design Process Through Determining and Applying Logical-to-Physical Design Mappings," at http://www.dtic.mil/cgi-bin/GetTRDoc?AD=ADA451583, pp. 1-12 (Jan. 1, 2000).

Knittel et al., "Integrating Logic Analyzer Functionality into VHDL Designs," IEEE 2008 Int'l Conf. on Reconfig. Comp. & FPGAs, pp. 127-132 (2008).

Ehliar et al., "Using Partial Reconfigurability to Air Debugging of FPGA Designs," IEEE, pp. 215-220 (2011).

Arshak et al., "Testing FPGA based digital system using XILINX ChipScope™logic analyzer," IEEE 2006 ISSE, pp. 355-360 (2006).

ChipScope Pro 11.1 Software and Cores User Guide, UG029 (v.11.1), pp. 1-211 (Apr. 24, 2009).

Paulsson et al., "Exploitation of the External JTAG Interface for Internally Controlled Configuration Readback and Self-Reconfiguration of Spartan 3 FPGAs," IEEE Comp. Soc. Ann. Symp. on VLSI, pp. 304-309 (2008).

Khan et al., "gNOSIS: A Board-level Debugging and Verification Tool," Technical Report, MSR-TR-2010-06, Microsoft Corporation, pp. 1-9 (Jul. 2010).

7 Series FPGAs Configuration User Guide, UG470 (v.1.3), pp. 1-136 (Feb. 14, 2012).

Xilinx Partial Reconfiguration Guide, UG702 (v.13.3), pp. 1-128 (Oct. 19, 2011).

International Search Report for PCT Appilcation No. PCT/EP2014/05625 dated Sep. 18, 2014 with English translation.

Office Action issued in corresponding Chinese Application No. 201410046770.X, dated Oct. 27, 2017, with English translation.

Office Action issued in corresponding Japanese Application No. 2014-024455, issued Nov. 28, 2017, with English translation.

Chinese Office Action for Chinese Application No. 201410046770.X dated Jun. 5, 2018 with English translation.

Chinese Office Action for Chinese Application No. 201480008273.9 dated Feb. 2, 2018 with English translation.

Japanese Office Action for Japanese Application No. 2015-556530 dated Feb. 5, 2018 with English translation.

Chinese Office Action for Chinese Application No. 20140008273.9 dated Jun. 12, 2018 with English translation.

* cited by examiner

ALTERATION OF A SIGNAL VALUE FOR AN FPGA AT RUNTIME

This nonprovisional application is a continuation of International Application No. PCT/EP2014/052625, filed Feb. 11, 2014, which claims priority to European Patent Application No. 13154741.6, filed Feb. 11, 2013, and German Patent Application No. 10 2013 101 300.7, filed Feb. 11, 2013, all of which is herein incorporated by reference.

BACKGROUND OF THE INVENTION

Field of the Invention

The present invention relates to a method for altering a signal value for a field-programmable gate array (FPGA) at runtime. The invention also relates to a data processing device with a processor unit and an FPGA, wherein the data processing device is configured to perform the abovementioned method. The invention furthermore relates to a computer program product with computer-implemented prompts which upon charging and implementation in an appropriate data processing device is able to perform the steps of the abovementioned method. It also relates to a digital memory device with electronically readable control signals which can interact with a programmable data processing device in such a way that the abovementioned method can be performed. Lastly, the invention comprises a method for performing an FPGA build on the basis of an FPGA model in a hardware description language. The hardware description language can exist in text format, such as VHDL (VHSIC Hardware Description Language), or graphically, such as in the form of a Simulink Program.

Description of the Background Art

The real-time simulation of complex, dynamic models places high demands even on modern computation nodes due to the tight time constraints. In automotive hardware-in-the-loop simulations (HiL), such models are mainly used where there is a need to close fast control loops, e.g. for highly dynamic components of the environment model. This is the case, for example, with the simulation of cylinder pressure sensors which play an increasing role in the reduction of usage or emissions. However, also in controlled systems which exhibit high dynamics, such as for example in electric motors, short cycle times and low latencies are essential.

These can hardly be implemented any longer with CPU-based simulations. Also in the area of rapid control prototyping (RCP), more and more FPGAs are making their arrival as simulated environment models (e.g. simulated electric motor) or controlling devices must become more and more accurate and complex. In this context, for example, complex control parts are outsourced to an FPGA to ensure sufficiently precise and fast reaction times.

Field programmable gate arrays (FPGAs) are able to support computation nodes during real-time simulation by taking on the calculation of dynamic model parts. By using FPGAs, their high flexibility and option of parallel processing of signals can easily fulfill the difficult real-time demands. The FPGAs can serve as hardware accelerators for computation node CPUs. One example of such an extension of an HiL simulator is the DS5203-FPGA Board by dSPACE. Very dynamic parts of the environment model, e.g., are outsourced to the FPGA so that the controlling device is assured sufficiently precise and fast reaction times. An FPGA hardware configuration is typically generated based on an FPGA model in a hardware description language in a build process.

The models of a controlled system are becoming progressively complex due to increasing demands on precision and are thus difficult to manage. In the automotive HiL-environment, such models generally are created with the toolset Matlab/Simulink by The MathWorks, Inc. Simulink offers a block-based view of such models in the form of a block diagram. In a block diagram, model components can be combined into subsystems and linked to each other by signals. The flow of data between these blocks is in this case represented with signal lines.

In a CPU-based real-time simulation, the block diagram of a model is first converted to C/C++ source files with the help of the Simulink coder. The source files are then converted via a compiler into an executable application which can be run on a computation node with a real-time compatible operating system. Additionally, a trace file is generated at the CPU build which represents a topology file with its graphic modeling, e.g. in Simulink. A TRC file contains all accessible variables and displays the variables in memory locations. The variables can be stored in a topology similar to the one of the model.

The conversion of a model to a CPU-application has the result that the simulation calculations are performed sequentially in an incremental manner. A consistent image of all model conditions or model variables, e.g. data on the signal lines or input/output values of the blocks, is thereby always present in the main memory of the computation node. With direct access to the main memory, the model variables can be analyzed and/or manipulated in an experimental tool such as ControlDesk. An optional read-write access to variables of the HiL simulation is possible. Using the trace file, signal values such as engine speed can be selected and displayed or manipulated via a display. In the HiL-environment, this practice is typically summarized under the terms "measurement" and "adjustment".

An FPGA-based simulation can be mapped in a block diagram with Simulink analog to the CPU-based simulation with the help of the Xilinx System Generator (XSG) and the FPGA Programming Blockset by dSPACE.

However, in contrast to the CPU-simulation, this model is not converted to an iterative programming language but instead to a hardware description language that writes to a customer-specific, digital circuit. The description of this customer-specific, digital circuit is converted to an FPGA configuration data stream via a synthesis process. Particularly in the realm of controlling device calibration for which a great number of parameters must be adjusted, a resource and time saving process is necessary. Calibration data is usually implemented as an invariable so that a change to the FPGA runtime is generally not possible.

For some FPGAs, it is possible to freeze and read out the complete state of the FPGA for debugging purposes. Due to the closed input/output data behavior of the FPGA, it is not possible to randomly access and possibly alter model states analog to the main memory of a computation node. Each model variable that the user wishes to measure or adjust must be guided to the FPGA interfaces through explicit modeling via signal lines. Following this adjustment, the model has to be newly converted which can take several hours. This factor can lead to very long development cycles of FPGA-based real-time simulations. Particularly in the realm of calibration, e.g. of controlling devices, this can call for a large number of resources if a great number of parameters need to be adjusted.

SUMMARY OF THE INVENTION

It is therefore an object of the invention to provide a method, a data processing device, a computer program product as well as a digital memory device with electronically readable control signals that allows an alteration of model variables in the FPGA at runtime and a shortening of iterative development cycles when performing FPGA-based real-time simulations.

In an embodiment, a method for changing a signal value of an FPGA at runtime is thus specified comprising the steps of loading an FPGA hardware configuration with at least one signal value onto the FPGA, performing the FPGA hardware configuration on the FPGA, setting the signal value for transfer to the FPGA, determining writeback data from the signal value, writing the writeback data as status data to a configuration memory of the FPGA, and transferring the status data from the configuration memory into the functional level of the FPGA.

In an embodiment, a data processing device with a processor unit and an FPGA are specified, wherein the data processing device is configured to perform the abovementioned method.

In an embodiment, a computer program product with computer-implemented prompts is also specified which, upon charging and executing in an appropriate data processing device, performs the steps of the abovementioned method.

Furthermore in accordance with an embodiment of the invention, a digital memory device with electronically readable control signals is specified which can interact in such a way with a programmable data processing device that the abovementioned method is performed on the data processing device.

A feature of the invention is therefore to enable the alteration of an FPGA signal value at runtime, achieved by the status data being written into the functional level of the FPGA during the operation of the FPGA in order to change a signal value. The status data is changed as needed in order to effect an alteration of the signal value in the FPGA therefrom, wherein structural alterations at the FPGA are not necessary. An interruption of the FPGA operation is also not necessary. In this way, it is possible to randomly access signal values of the FPGA for alteration. The alteration of the signal values can occur, as known from the running of software on a CPU, inclusive of access via topology files (trace file) and graphic modeling with Simulink. Signal values such as ignition timing can be selected and displayed and/or changed accordingly.

The alteration of an FPGA signal value merely requires writing a value for the signal value onto the FPGA. It is not necessary that the written value differ from a previously set value of the signal value. Since in practice the value of the signal value is usually altered, the term alteration was used here.

Access to the FPGA signal value can also be made possible by reading out status data from the FPGA during FPGA operation and determining the signal value therefrom. The status data is read out and combined if needed, wherein structural alterations on the FPGA are not necessary. An interruption of the FPGA operation is also unnecessary. In this way, signal values of the FPGA are randomly accessible. The access to the signal values can occur with access via topology files (trace file) and graphic modeling with Simulink as known from the running of software on a CPU. Signal values such as motor speed can be selected and displayed and/or manipulated accordingly.

Furthermore, a method for accessing an FPGA signal value at runtime is thus specified comprising the steps of loading an FPGA hardware configuration onto the FPGA, executing the FPGA hardware configuration on the FPGA, requesting an FPGA signal value, transferring the status data from the functional level of the FPGA to a configuration memory on its configuration level, reading the status data from the configuration memory as readback data, and determining the signal value from the readback data. The individual steps correspond to the previously described steps of the method for changing a signal value. Advantageously, no changes are necessary for the implementation of the FPGA so that the demand for resources and performance of the FPGA is unchanged. Accordingly, the access to the signal value has no impact on normal operation, whether in regards to the FPGA hardware configuration generated nor during implementation. States of different model variables can be consistently stored in order to facilitate access. Access to desired signal values can occur without the need for an altered FPGA hardware configuration to be generated and transferred to the FPGA, resulting in shorter development times. Impact on available resources and the real-time behavior of the FPGA are avoided or reduced. In particular, different signal values can be read out from the FPGA without changing the FPGA hardware configuration.

The configuration level relates to a logical level of the FPGA which serves to initialize the FPGA. During an initial configuration process, the configuration data can be written into the configuration memory, wherein the functional level subsequently acts as if modeled. During operation, all register content of the functional level can be mirrored back to the configuration level, via e.g. a trigger. Subsequently, the contents of the configuration memory can be read out in order to determine the signal value therefrom. Conversely, all content of the configuration memory can be transferred during operation from the configuration level to the register content of the functional level, via e.g. a trigger. Such a trigger can be a reset signal, for example. A reset signal can be set for a portion of the FPGA or explicitly configured for a number of registers in the FPGA program. For alterations of look-up tables and multiplexers, such a trigger can be unnecessary when changes at the configuration level directly impact the functional level.

The selection of the signal value may be randomly changed during runtime. Access to a plurality of signal values can occur as readback and/or writeback data.

The readback and/or writeback data can contain any data unit of the FPGA. The readback and/or writeback data may include individual register values and larger memory blocks of the FPGA. The memory blocks can be, for example, readback columns of the FPGA. Readback and/or writeback data are structurally the same and are merely differentiated on a conceptual basis. The signal values to be changed can be implemented as constants in the FPGA, for example as Simulink constant blocks, which only need to be adjusted during development.

The order of the specified process can basically vary and is not limited to the order provided herewith. In particular, the process can be performed after loading and running of a FPGA hardware configuration for the alteration of a signal value and/or for access thereto, in order to repeatedly access or change signal values.

The result is write access on the FPGA. This access takes place at runtime without FPGA influence. The details described are valid for the read access of FPGA signal values as well as for the write access of FPGA signal values which are individually available as needed.

During write access for the alteration of an FPGA signal value, a dynamic, partial reconfiguration of the FPGA takes place, wherein the respective, relevant parts of the FPGA, which comprise the signal value, are overwritten at runtime.

Thereby, a Simulink constant block or any other modeling of a signal value can be mapped on a reconfigurable look-up table, a reconfigurable register or a reconfigurable multiplexer. Via partial, dynamic reconfiguration of the look-up table, the register or the multiplexer, the mapped signal value can be changed during FPGA runtime. Signal values which comprise several bits can be split and mapped onto several elements, if necessary. Depending on the FPGA and FPGA program used, a varying mapping of the signal values onto FPGA elements can be advantageous. An analysis prior to the build of the FPGA program can determine a mapping.

The data processing device can generally be performed arbitrarily. The FPGA is typically arranged as an extension module in the data processing device or connected thereto. The data processing device can be connected to a distant control computer via a data connection.

Access to the signal value can take place via an application on the control computer.

The representation of the signal value can be graphical. The signal value can be dragged from a list using "drag and drop" onto the available instruments which display signal values. Vice versa, a signal value that needs to be changed can also be selected from the "drag and drop" list. Furthermore, a value for a signal value that needs to be changed can be set on a selected signal value with "drag and drop". The read out of the status data from the configuration memory as read-back data does not entail alteration of the data; it is merely the case of a conceptual definition. The same is true for the write-back data. The term write-back data is merely to show that a signal value is written into the FPGA in order to alter the signal value in the FPGA.

Determining the signal value from the readback data and/or determining the writeback data from the signal value can generally take place at any location, e.g. in the FPGA, the CPU of the data processing device, or the control computer. Accordingly, the status data, register data or signal value can be transferred as needed.

Read and/or write access to the configuration memory of the FPGA from outside the FPGA occurs via an interface. A typical architecture of the configuration memory includes an interface of 32-bit width and a clock frequency of 100 MHz with a minimal amount of read out of a frame. The same is true for the write access. With the FPGAs available today, it is thus not possible to apply the method as an FPGA debugger or FPGA scope with cycle-precise access in FPGA time. Aside from register values, a frame can contain information of a look-up table or multiplexer configuration, i.e. wiring configuration. Determining a signal value from the read out data, for example, comprises the locating and extracting of register values from a frame. Accordingly, determining writeback data from the signal value includes, for example, the locating of register values in a frame and the setting of register values in accordance with the signal value. Read and/or write access to the configuration memory of the FPGA is also possible from within the FPGA via an internal interface. One example of such an internal interface is the "internal configuration access port" (ICAP) by the company Xilinx.

In an embodiment of the invention, the method can include the additional step of transferring status data from the functional level of the FPGA into the configuration memory in its configuration level, prior to transferring status data from the configuration memory into the functional level of the FPGA. Accordingly, an initialization of the configuration level of the FPGA can be performed, for example, before the writeback data is transferred into the configuration level of the FPGA as status data. An alteration of the signal value can also, for example, originate from the signal value previously read out. When the status data is transferred from the configuration memory into the functional level of the FPGA in units larger than the signal values to be changed, the configuration memory can be initialized by the previously transferred status data of the functional level so that after transfer of the status data into the functional level not only the original signal value but also the original state is restored. Accordingly, the signal value can be changed without the FPGA changing any other behavior at runtime. This is especially true when the status data that is to be transferred into the functional level represents constant values which do not change during runtime. Generally, this is also true when between transferring status data into the configuration level and transferring status data into the functional level no alteration of the functional level has occurred. During transfer of status data into the functional level of the FPGA, the writeback data of the signal value can include additional information. For this reason, the status data can be read out first as a basis for the writeback data and that the signal value can be inserted into this status data. The data integrity of the FPGA can thus be assured.

The signal values can be arranged together already during the creation of the FPGA program. These can be changed separately from FPGA elements in the functional level whose configuration may change at runtime, for example in the form of variables. In this way, it can be assured that parts of the FPGA which may have changed during runtime are not overwritten during a partial reconfiguration. Otherwise, since the FPGA continues to run during the procedure, changes could result between transfer of the status data from the functional level and the transfer of the writeback data into the functional level due to the operation of the FPGA, which could then be reversed by the described method.

If no elements that change at runtime are present in the segment to be written, it is unnecessary to transmit and read out the status data of the segment to be written into the configuration level prior to each alteration of the signal value. It is generally sufficient to read out the status data once as the status data does not change during FPGA runtime.

As the configuration of the elements is defined during initialization of the FPGA, the basic initialization of the FPGA can be alternatively stored and these values can be utilized to write to the area of the configuration level.

In an embodiment of the invention, the step of defining the writeback data from the signal value can include the mapping of the signal value to the writeback data. In an embodiment of the invention, the step of defining the readback data from the signal value comprises the mapping of the signal value to the readback data. The mapping to define the writeback data from the signal value or the signal value from the readback data is realized as a register, look-up table, multiplexer or via the wiring conform to the representation of the signal value in the FPGA. For example, the registers represent memory in the functional level whose data can simply be copied and used to determine the signal value. This allows the identification of the data in order to determine the signal value. As the individual registers cannot be read out or written to, but instead the configuration level can only partially be edited, the signal value must be mapped to the configuration bits of the area.

In an embodiment of the invention, the step of defining the writeback data from the signal value comprises the defining of at least one register value of the FPGA from the signal value. In an embodiment of the invention, the step of defining the signal value from the readback data comprises the defining of the signal value from at least one register value of the FPGA. The organization of the signal value in the minimum of one register can be arbitrary, which is why the register content must be processed in order to define the signal value or to determine status data for the desired alteration of the signal value from the register content. The signal value can be split across multiple registers and the register content can be processed concurrently in order to define the signal value or the status data for the desired alteration of the signal value from numerous register contents.

In an embodiment of the invention, the step of writing the writeback data as status data in a configuration memory of the FPGA includes identifying areas of the configuration memory necessary for the alteration of the signal value and writing status data of the necessary areas of the configuration memory as writeback data. In an embodiment of the invention, the step of reading out the status data from the configuration memory as readback data includes identifying areas of the configuration memory necessary for the definition of the signal value and reading out status data of the necessary areas of the configuration memory as readback data. The addresses of the configuration memory via which the configuration bits of the register, look-up table or multiplexer, in which the signal value is coded, are to be addressed, are defined and selected during FPGA runtime dependent of the signal value that is to be adjusted so that the read or write access to the configuration memory can occur without prior adjustments of the FPGA hardware configuration. By identifying the necessary areas, the read out and/or writing of the status data can be confined to these areas, wherein little data needs to be read out, transferred, processed and/or written.

In an embodiment of the invention, the step of transferring the status data from the configuration memory into the functional level of the FPGA includes identifying parts of the functional level of the FPGA necessary for writing the status data and for transfer of these parts of the status data into the functional level. In an embodiment of the invention, the step of transferring status data from a functional level of the FPGA into a configuration memory in its configuration level includes identifying parts of the status data necessary to define the signal value and the backing up of these parts of the status data into its configuration memory. Areas/parts that are to be transferred and/or written are identified at runtime so that the transfer and/or writing of the status data can occur without prior adjustments of the FPGA hardware configuration. By identifying the necessary areas, the backup and/or storing of the status data can be confined to these areas, wherein little data needs to be backed up and/or stored.

In an embodiment of the invention, the identification of areas of the configuration memory necessary for the alteration of the signal value and/or identification of parts of the functional level of the FPGA necessary for the writing of the status data includes the identification of the respective areas via an identification number. The identification number can generally be determined at any time. The identification number can be determined by using a model of the FPGA hardware configuration. Each area can be assigned a unique identification number via which access is obtained. Signal values can thus, for example, be addressed to an area of the configuration memory via its identification number. The identification number can, for example, be configured as block ID for the identification of a model block. The block ID can be traced via the various steps of the FPGA program creation. The block ID allows a simple association of an FPGA element such as a register, look-up table or multiplexer to a model block.

In an embodiment of the invention, the step of setting the signal value for transfer to the FPGA includes making available a list of available signal values and the selection of a signal value from this list. In an embodiment of the invention, the step of requesting an FPGA signal value includes making available a list of available signal values and the selection of a signal value from this list. The list can generally be compiled at any time. The list can be compiled by using a model of the FPGA hardware configuration. Each signal value can be assigned a unique identification number via which access is obtained.

In an embodiment of the invention, the step of transferring the status data from the configuration memory into the functional level of the FPGA includes sending a reset signal to the FPGA. The reset signal is a signal which starts the transfer of the status data from the configuration memory into the functional level of the FPGA. Such a transfer can take place in a short time, in a few cycles for example, wherein by setting the reset signal, the point in time when the status data is transferred from the configuration memory into the functional level can be controlled. The reset signal can be a global reset signal which affects all elements of the FPGA whose configuration level areas participate in the reset.

In an embodiment of the invention, the step of sending a reset signal to the FPGA includes the sending of a reset signal for the partial transfer of status data from the configuration memory into the functional level of the FPGA. By way of the partial transfer of the status data, the alteration of the signal value can be efficiently completed. Only a few resources of the FPGA are needed which especially makes use in a real-time system easier. Through a dedicated reset line which only addresses the adjustable registers, unwanted effects that can occur with a global reset can be avoided.

If the signal values that are to be adjusted are implemented in the form of look-up tables or multiplexers, a reset line is not necessary if the configuration level data is directly taken over by the look-up table or the multiplexers.

In an embodiment of the invention, the step of running the FPGA hardware configuration on the FPGA includes the running of the hardware configuration as a real-time application, and the method for changing an FPGA signal value takes place during runtime of the real-time application. Real-time applications are very time-sensitive so that just an alteration of available resources can lead to a change in the behavior of the real-time application. When using the invented method, a signal value can be altered or be accessed read-only without the need for changing FPGA hardware configuration resources. The alteration of the signal value can occur independent of the implementation of the FPGA hardware configuration so that no relevant impact on the FPGA hardware configuration occurs due to the alteration of a signal value.

Furthermore, a method for performing an FPGA build based on an FPGA model in a hardware description language is provided, which includes the steps of creating an FPGA hardware configuration, identifying memory locations of a configuration memory for status data with at least one signal value based on the FPGA hardware configuration and the compilation of a list with signal values accessible during runtime and the corresponding memory locations thereto.

The invention further provides a method for implementing an FPGA build based on an FPGA model in a hardware description language which includes the steps of creating an FPGA hardware configuration with a plurality of signal values, arranging signal values in adjacent areas of the FPGA hardware configuration, identifying memory locations of a configuration memory for status data of the plurality of signal values based on the FPGA hardware configuration, and compiling a list of signal values that can be accessed and/or changed at runtime, with their corresponding memory locations.

The basic idea of this method is therefore to collect required data on signal values when creating an FPGA hardware configuration and to process it in such a way that the signal value can be mapped based on acquired status data at runtime of the FPGA. Conversely, a signal value in the FPGA can also be easily changed by the known relationship between status data and signal values.

In addition, the adjacent array of the signal values ensures that access to these signal values for read-only access or their alteration can occur simply and with the use of only few resources.

Memory locations can be registers of the FPGA. Registers can be explicitly modeled in the model or, for example, be implicitly modeled with delay by using blocks. The model can be generated graphically.

The order of the specified process can generally vary and is not limited to the order specified here. For example, compiling a list of signal values accessible and/or changeable at runtime can be carried out starting from the model in the hardware description language at an earlier stage.

The process specified here for the performance of an FPGA build can be part of a build process for a data processing device with an FPGA, wherein the data processing device includes the FPGA or is connected thereto. In addition, in this process a build for the CPU of the data processing device is performed, wherein a CPU trace file is generated in a CPU trace file generator. Additionally, the list of signal values accessible at runtime and the corresponding memory locations, referred to herein as "logic allocation file", is converted into a machine-readable file. Furthermore, a trace file for the FPGA is generated quid pro quo to the trace file of the CPU. In a further step, the trace files of the CPU and the FPGA are combined in a trace file merger. As a result, access to signal values and/or an alteration of a signal value can, for example, take place from a control computer independent of the implementation of the running in the CPU or FPGA.

In an embodiment of the invention, the method includes the additional step of implementing a reset signal for the transfer of status data from the configuration memory into the functional level of the FPGA, wherein the transfer of status data from the configuration memory into the functional level of the FPGA includes the partial transfer of status data from the adjacent areas of the FPGA hardware configuration with the signal values. The reset signal is the signal which starts the transfer of the status data from the configuration memory into the functional level of the FPGA. Such a transfer can take place in a short time, in a few cycles for example, wherein by setting the reset signal, the point in time that the status data is to be transferred from the configuration memory into the functional level can be controlled. The respective, relevant components of the FPGA can thereby be overwritten during operation via a partial, dynamic reconfiguration of the FPGA. The signal value, for example a Simulink constant block, is mapped to the FPGA, i.e. the reconfigurable look-up table, the register or the multiplexer. Subsequently, the signal value is changed to a random value via partial, dynamic reconfiguration.

In an embodiment of the invention, the step of implementing a reset signal for the transfer of status data from the configuration memory into the functional level of the FPGA includes the implementation of a reset signal for the partial transfer of status data from the configuration memory into the functional level of the FPGA. The partial transfer of status data allows the efficient running of the signal value alteration. Only few FPGA resources are required which especially facilitates an application in a real-time system.

In an embodiment of the invention, the step of compiling a list of accessible and/or changeable signal values and their corresponding memory locations include the identification of a link between the memory locations for the formation of the signal value. The list thus contains concrete information as to how a signal value is determined from status data.

In an embodiment of the invention, the method includes the additional step of creating an FPGA code for determining a signal value, wherein the FGPA code includes the read out of the status data from the configuration memory as readback data and the specification of the signal value from the readback data based on the list of readable signal values and their corresponding memory locations. A subsequent processing of the status data for determining the signal value can thus be fully performed in the FPGA. Accordingly, only the specific signal value needs to be transferred from the FPGA, wherein its interface is relieved.

In an embodiment of the invention, the method includes the additional step of creating an FPGA code for changing a signal value, wherein the FGPA code includes the determination of readback data based on the list of readable signal values and their corresponding memory locations, and the writing of writeback data as status data in the configuration memory of the FPGA. A processing of the signal value for determining the status data can thus be fully performed in the FPGA. Accordingly, only the signal value to be changed is transferred to the FPGA, wherein its interface is relieved. The FPGA can read out and write its own configuration memory via an internal interface. One example of such an internal interface is the "internal configuration access port" (ICAP) by the company Xilinx. Alternately, implementation with a microprocessor, for example a Microblaze, is possible.

The configuration level of an FPGA can be read only column by column via a readback or via partial reconfiguration. Hereafter, these columns are called readback columns. In an embodiment of the invention, the method includes the additional step of optimizing the FPGA hardware configuration with the arrangement of memory locations, which contain status data for a signal value, in a readback column of the FPGA. The arrangement in a readback column provides accelerated access to the status data for a signal value and/or alteration of a signal value in the FPGA. By arranging all memory locations for a signal value in one readback column, these can be accessed with one operation. A sorting of memory locations into readback columns thus takes place prior to generating the FPGA hardware configuration.

In an embodiment of the invention, the method includes the additional step of optimizing the FPGA hardware configuration in adjacent areas of the FPGA with the arrangement of memory locations, which contain states for a signal value. Neighboring areas may relate to an individual readback column of the FPGA or to a plurality of neighboring readback columns. The neighboring arrangement accelerates access to the memory locations. In an arrangement of memory locations for two signal values in a readback column, both can be accessed with one operation. The same is true for written access, wherein only signal values that are at least temporarily located in a memory location can be written into the FPGA.

In an embodiment of the invention, the method includes the additional step of adding memory locations to outputs of logical blocks for the provision of status data. The memory locations, normally registers, allow the read out of status data in order to determine signal values therefrom. An elevated amount of available status data provides access to an elevated number of signal values.

In an embodiment of the invention, the FPGA is a Xilinx FPGA. The Xilinx FPGA offers the option of repeated FPGA configuration as well as the option of partial read out and configuration of the FPGA during operation.

Further scope of applicability of the present invention will become apparent from the detailed description given hereinafter. However, it should be understood that the detailed description and specific examples, while indicating exemplary embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
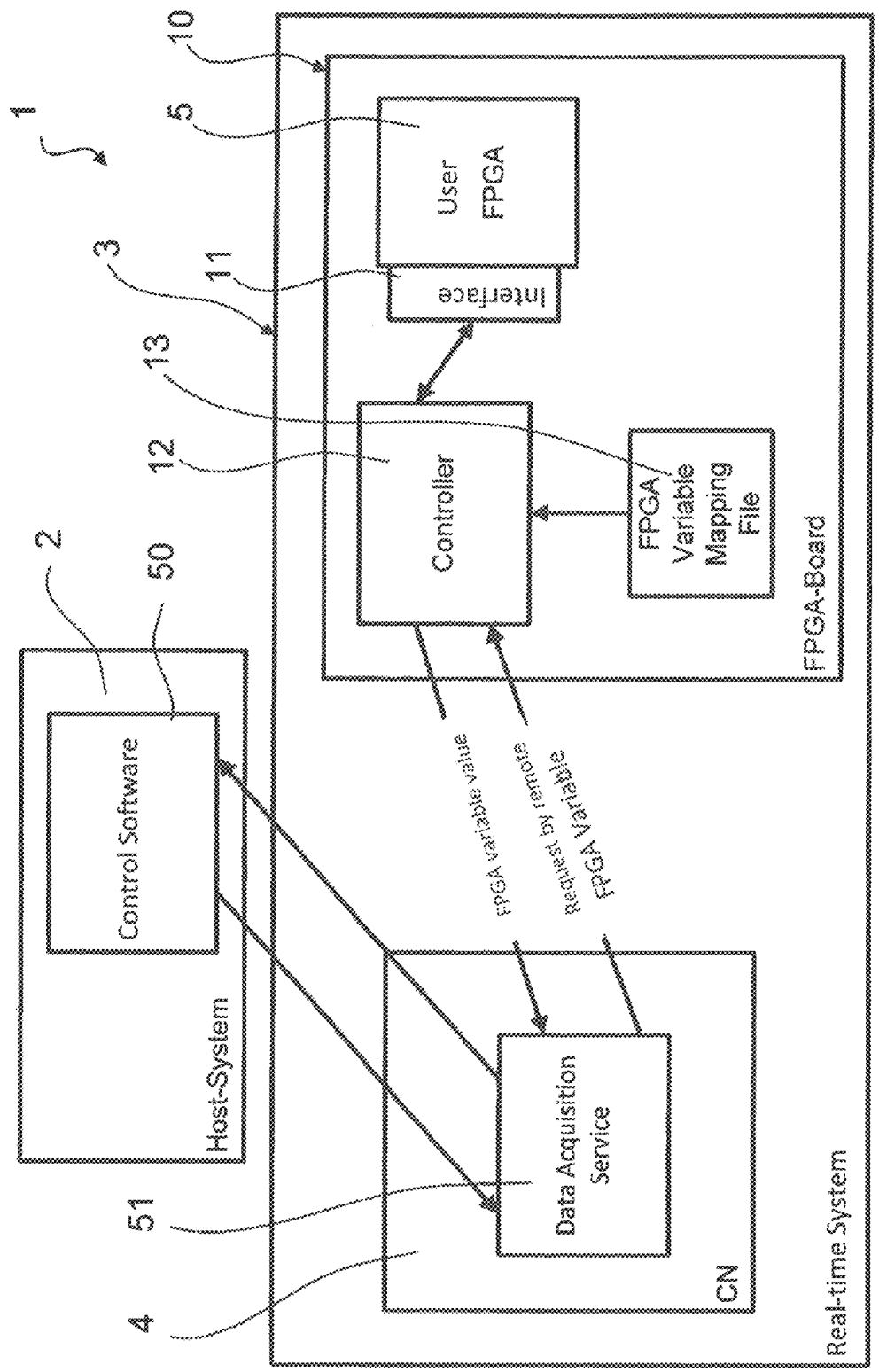
FIG. 1 is a schematic representation of a data processing system with a control computer and a real-time system.
Figure 2:
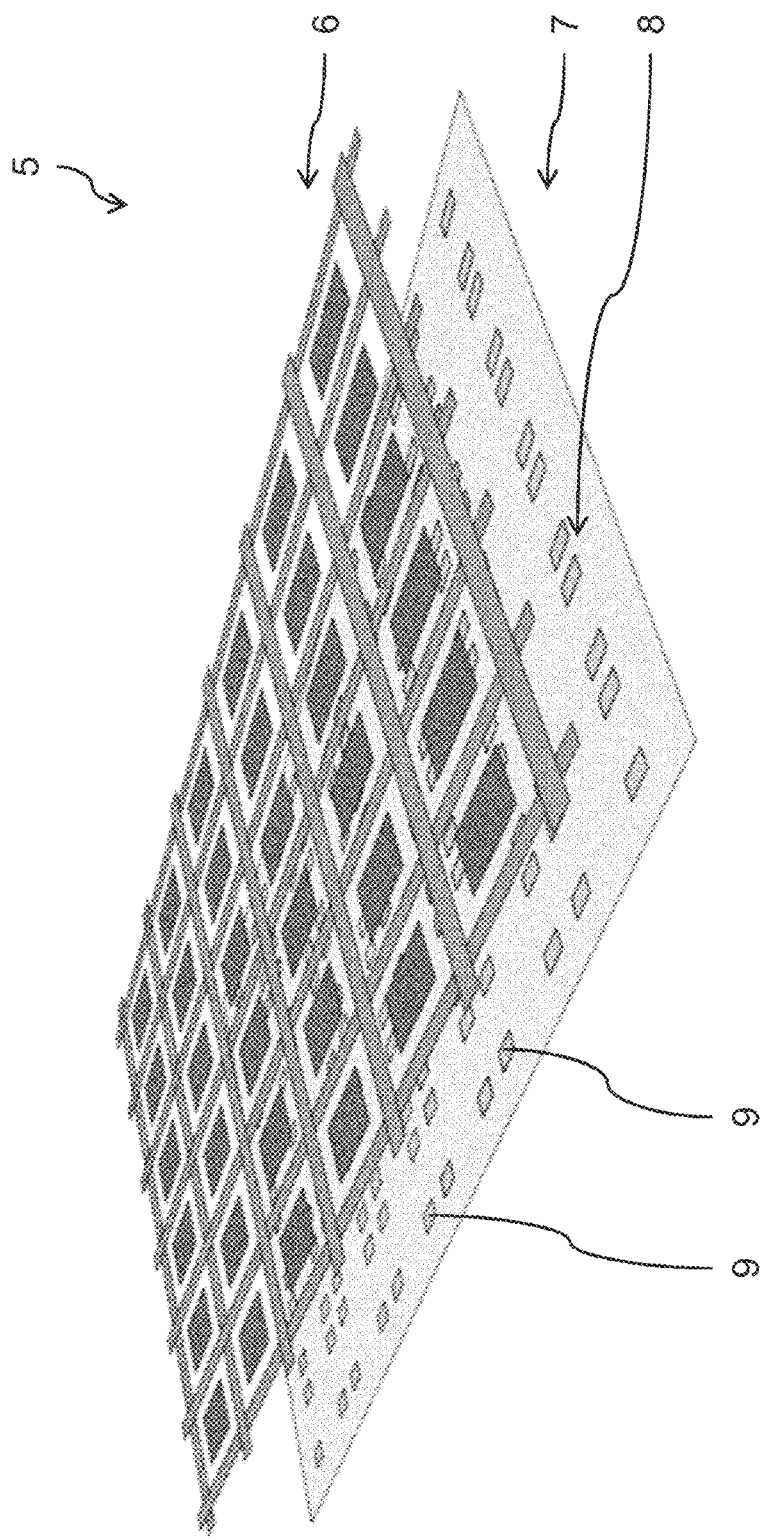
FIG. 2 shows a detailed view of an FPGA real-time system of FIG. 1.
Figure 12:
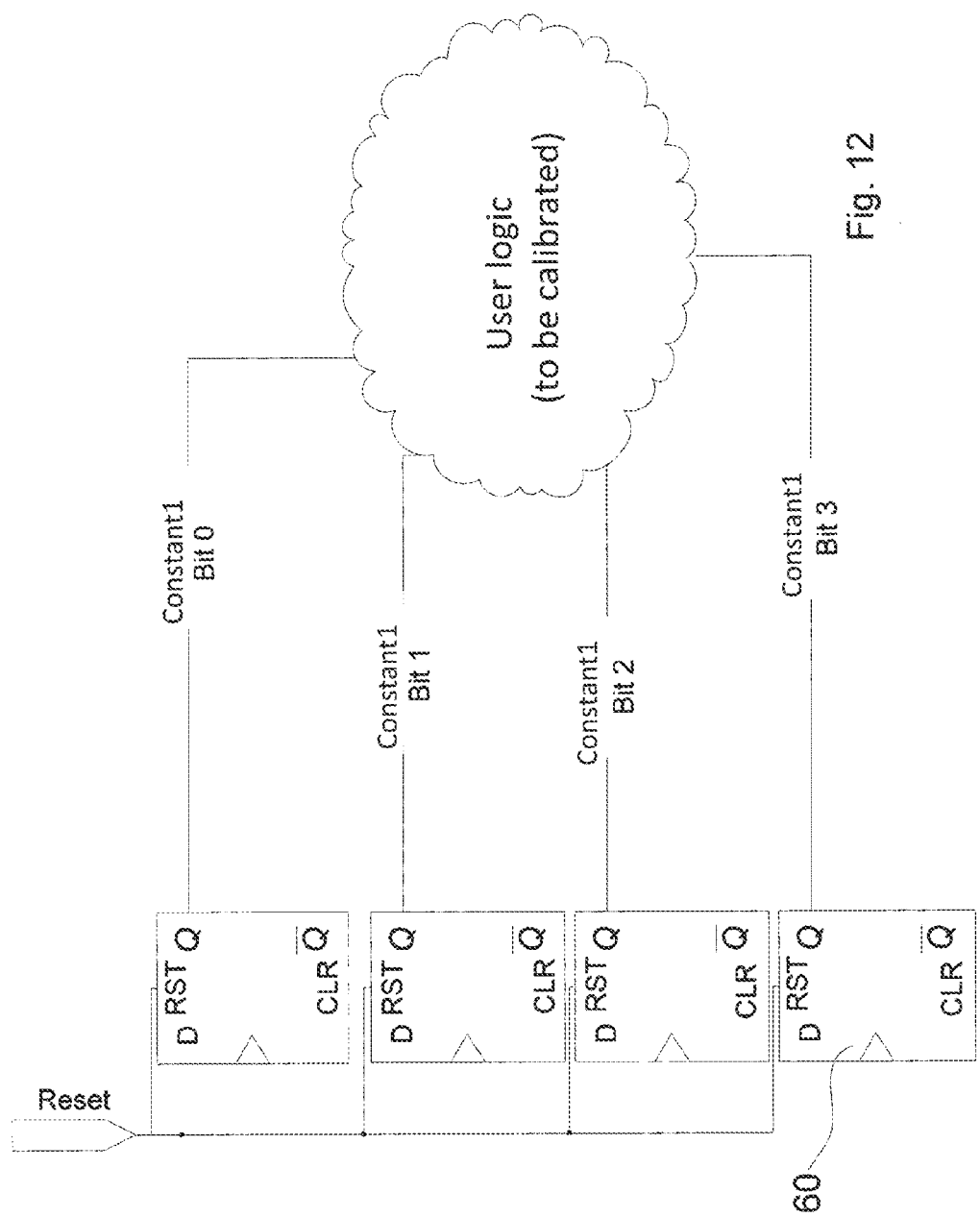
FIG. 12 is a schematic representation of an implementation of a signal value on an FPGA via a register.
Figure 13:
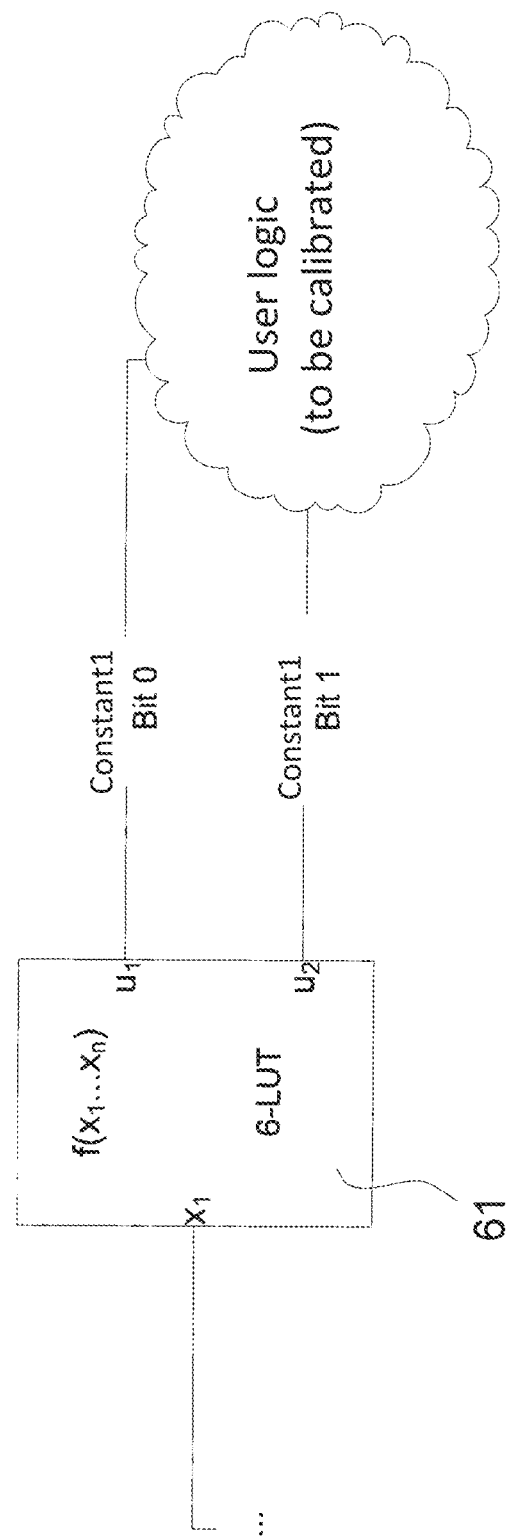
FIG. 13 is a schematic representation of an implementation of a signal value on an FPGA via a look-up table.
Figure 14:
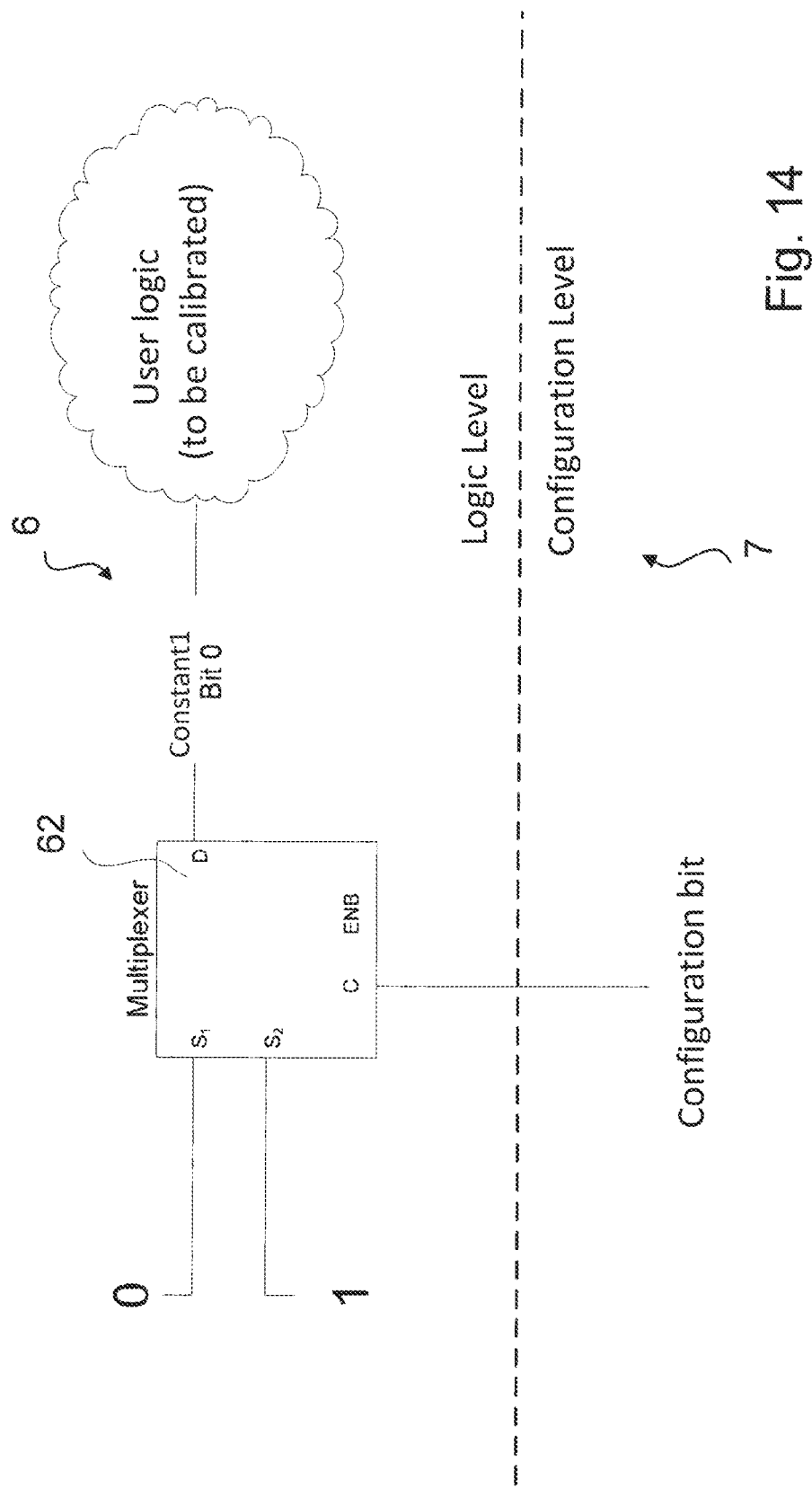
FIG. 14 is a schematic representation of an implementation of a signal value on an FPGA via a multiplexer.
Figure 15:
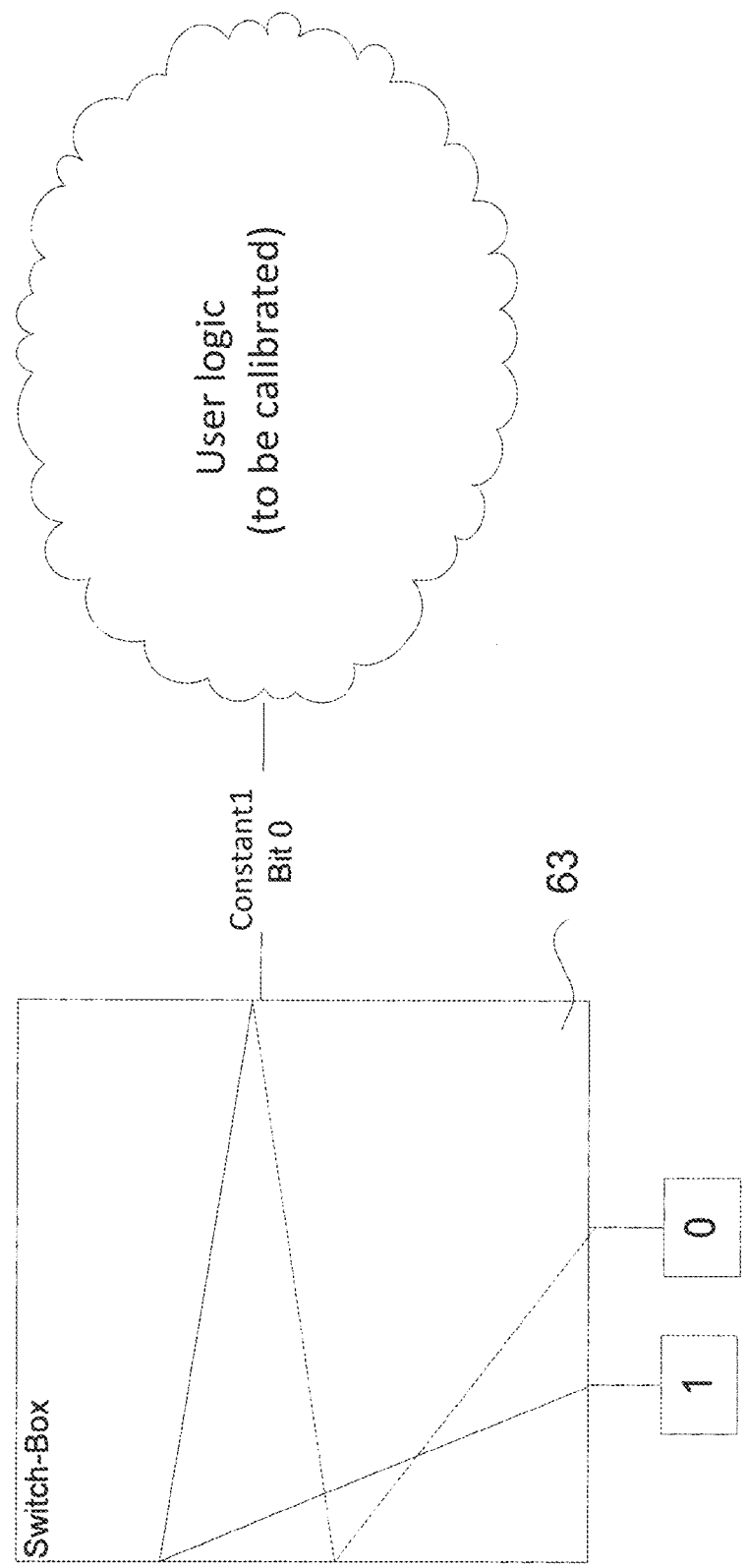
FIG. 15 is a schematic representation of an implementation of a signal value on an FPGA using routing to VCC/GND.

FIG. 1 shows a construction according to the invention of a data processing system 1 with a control computer 2, characterized herein as a host system, and a real-time system 3. The real-time system 3 is connected to the control computer 2 via a network connection not explicitly shown. The real-time system 3 comprises a computation node 4, also referred to as CN, with a CPU, not shown, as well as an FPGA 5, which in this embodiment is a Xilinx FPGA. The real-time system 3 shown here can be any data processing device. The FPGA 5 is shown schematically in FIG. 2 and includes a functional level 6 and a configuration level 7. In the configuration level 7, a configuration memory 8 is arranged with a plurality of memory locations 9. The configuration level 7 is a logical level of the FPGA 5 for its initialization. During an initial configuration process, configuration data in the configuration memory 8 is written and transferred into the functional level 6. In this embodiment, the memory locations 9 correspond to registers 60 of the FPGA 5, such as is shown in FIG. 12. Alternative embodiments relate to an implementation of memory locations 9 through the look-up table 61, as shown in FIG. 13, the multiplexer 62, as shown in FIG. 14, or as shown in FIG. 15 via routing to VCC/GND, which is implemented in a switch box 63, and relates to an alternate wiring to a power supply or to ground as the implementation of elementary, binary values.

The FPGA 5 is arranged on an FPGA board 10 and linked via an interface 11 with a controller 12 for access to the interface 11. The interface 11 here has a width of 32 bit at a clock frequency of 100 MHz with a minimum amount of one frame read. A frame can contain register values in any combination, information on a look-up table 61 and/or on multiplexer 62 or wiring configuration. On the FPGA board 10, an FPGA variable mapping file 13 is stored for access by the controller 12. The following explanations for accessing a signal value of the FPGA 5 or for changing a signal value of the FPGA 5 are valid for the change or the access, respectively. The signal value can be implemented alternatively by each register 60, look-up table 61, multiplexer 62 or via routing to VCC/GND.

Figure 3:
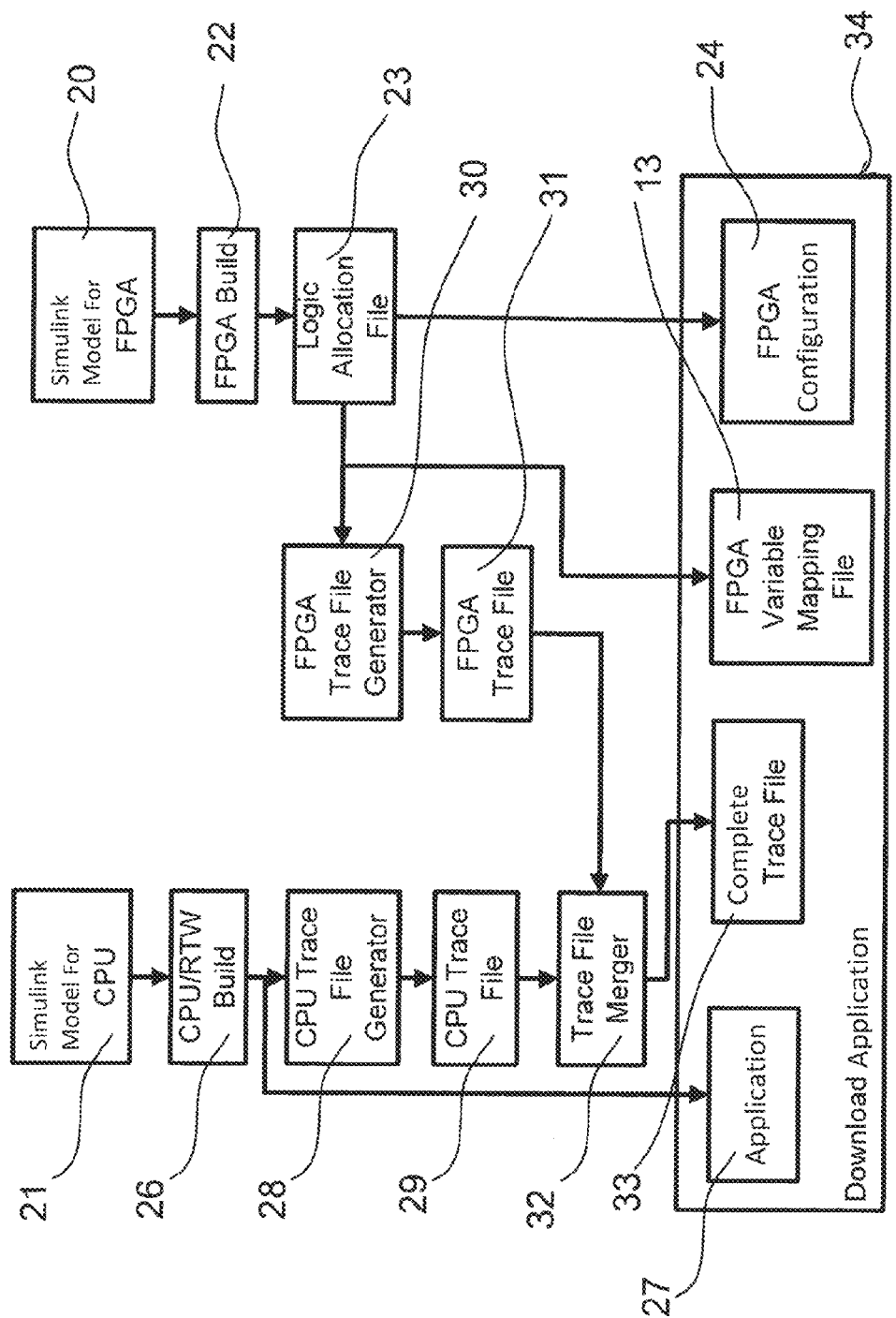
FIG. 3 is a diagram of a method for performing a build for the real-time system of FIG. 1.
Figure 16:
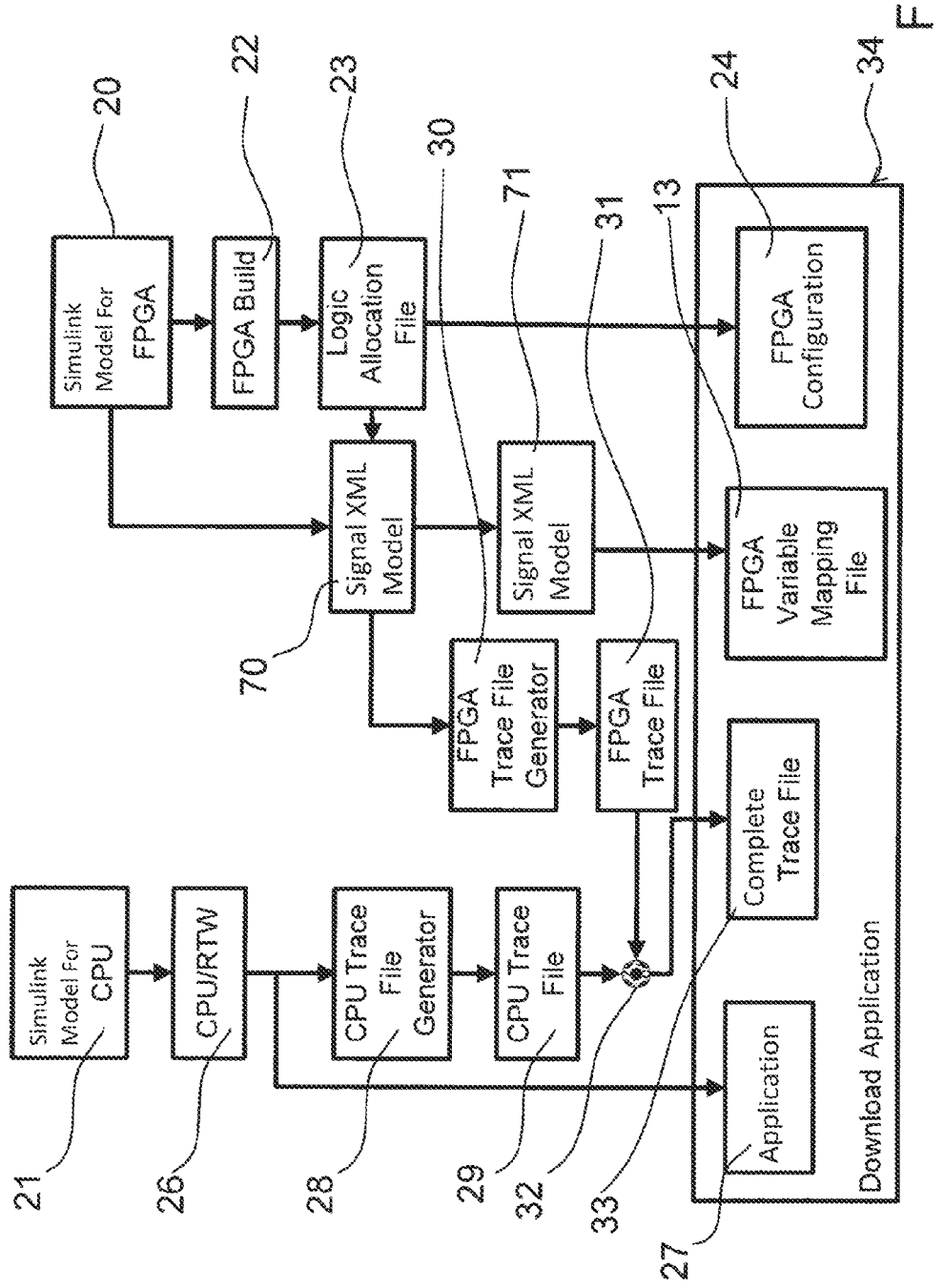
FIG. 16 is a diagram based on the diagram of FIG. 3 of a method for performing a build for the real-time system of FIG. 1 with additional details for the modeling of a signal.

A build is carried out in order to use the real-time system 3 as described below with reference to FIG. 3 or FIG. 16. As a starting point for the build, an FPGA model 20 and a CPU model 21 are used, both of which were generated with Simulink. In an FPGA build 22, a common hardware description language, a logic allocation file 23 and an FPGA hardware configuration 24 are produced from the FPGA model 20 via VHDL. In the logic allocation file 23, a list of memory locations 9 of the configuration memory 8 for status data from FPGA 5 signal values accessible at runtime is stored. Links of the memory locations 9 for forming the signal values are also determined and stored in the logic allocation file 23, so that, starting from the logic allocation file 23, a signal value can be determined from status data and vice versa.

The previously mentioned machine-readable FPGA variable mapping file 13 is generated from the file allocation logic 23 which contains the allocations of memory locations 9 to signal values in a machine-readable form. For this, a signal XML Model 70 is formed using the FPGA model 20 and the logic allocation file 23, as shown in detail in FIG. 16. The FPGA variable mapping file 13 is generated from the signal XML model 70 in a map file generator 71. From the CPU model 21, an executable application 27 is created in a CPU build 26 on the CPU of the real-time system 3. In a CPU trace file generator 28, a CPU trace file 29 is generated from the CPU build 26. Analogously, an FPGA trace file 31 is generated in an FPGA trace file generator 30 which receives the signal XML model 70 as input information. In a further step, the trace files 29, 31, are joined together in a trace file merger 32 to a complete trace file 33.

The build process delivers as an overall result a download application 34 for the real-time system 3 with the application 27, the full trace file 33, the FPGA variable mapping file 13 and the FPGA hardware configuration 24.

Figure 4:
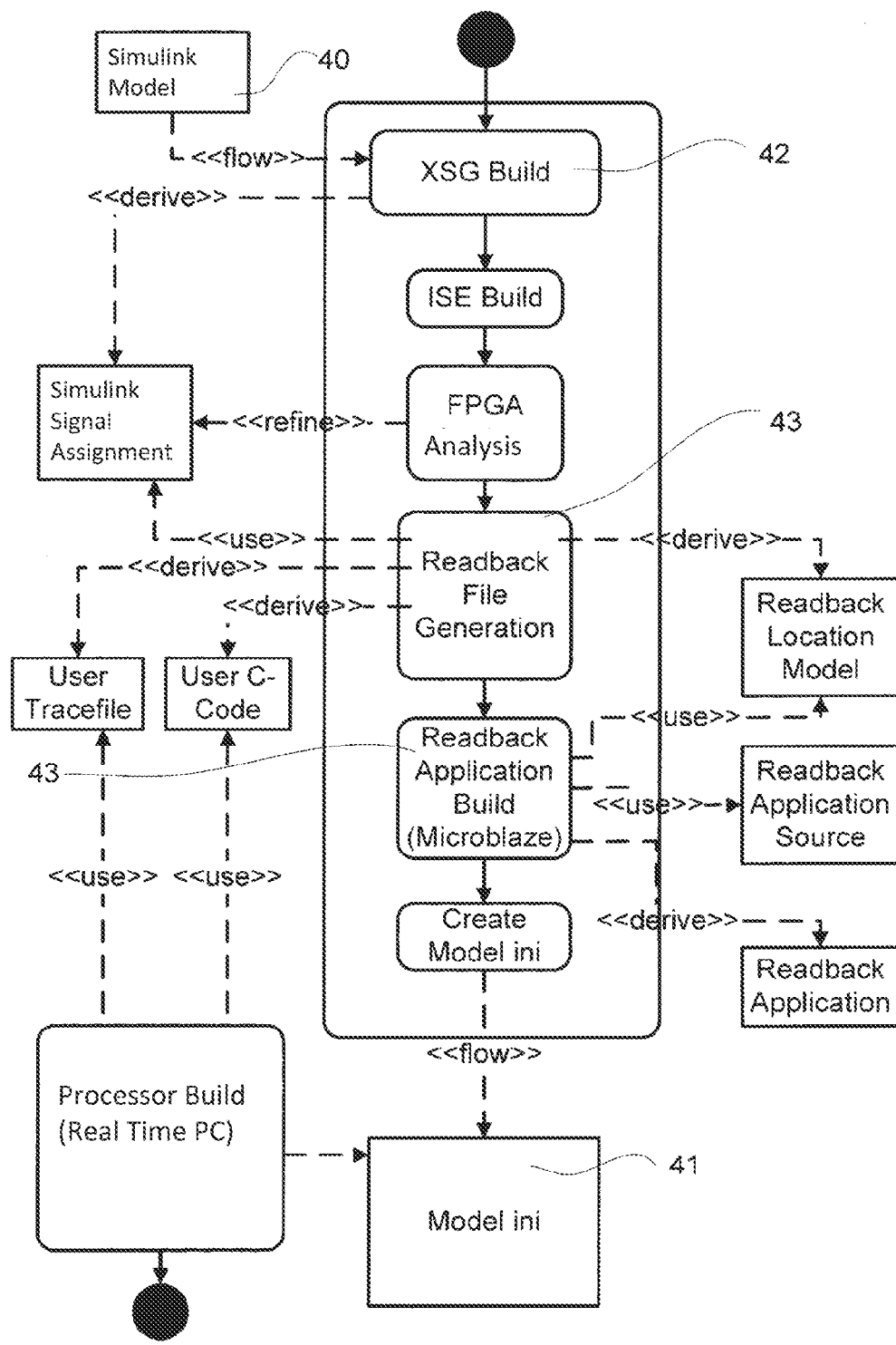
FIG. 4 shows a detailed view of an FPGA build of FIG. 3.

The FPGA build 22 is shown in detail in FIG. 4. As input, the FPGA build 22 receives a block diagram 40 of an FPGA subsystem which include a combination of primitive blocks such as addition, multiplication, etc. The result of the process is a model.ini-file 41 that contains the final bit stream as well as an interface description. The interface description contains a list of all interfaces that are instantiated in the FPGA subsystem. CPU interfaces corresponding to the FPGA interfaces can be generated through this description. In the first step of the FPGA build 22, an HDL description, which in this embodiment is a VHDL description, is generated from the block diagram 40 of the FPGA subsystem through the Xilinx system generator (XSG) 42. This description is subsequently transferred into a netlist via a synthesis tool (XST).

After the XSG build, the netlist of the Simulink model is merged with the other framework components to one complete netlist. The overall design is then transferred by an implementation process into a bit stream.

A relationship is established between the block outputs of the Simulink block diagram and the FPGA components (D flip-flops) or rather between the memory locations 9 in the configuration memory 8 which belong to the FPGA components. This image is gradually built up or refined during the FPGA build 22.

If the block diagram of an FPGA subsystem is transferred by the XSG to an HDL, these two descriptions are similar in terms of their structure. This can be exploited to create a direct relationship between, for example, a block output of a Simulink block and ports of an entity.

Figure 5:
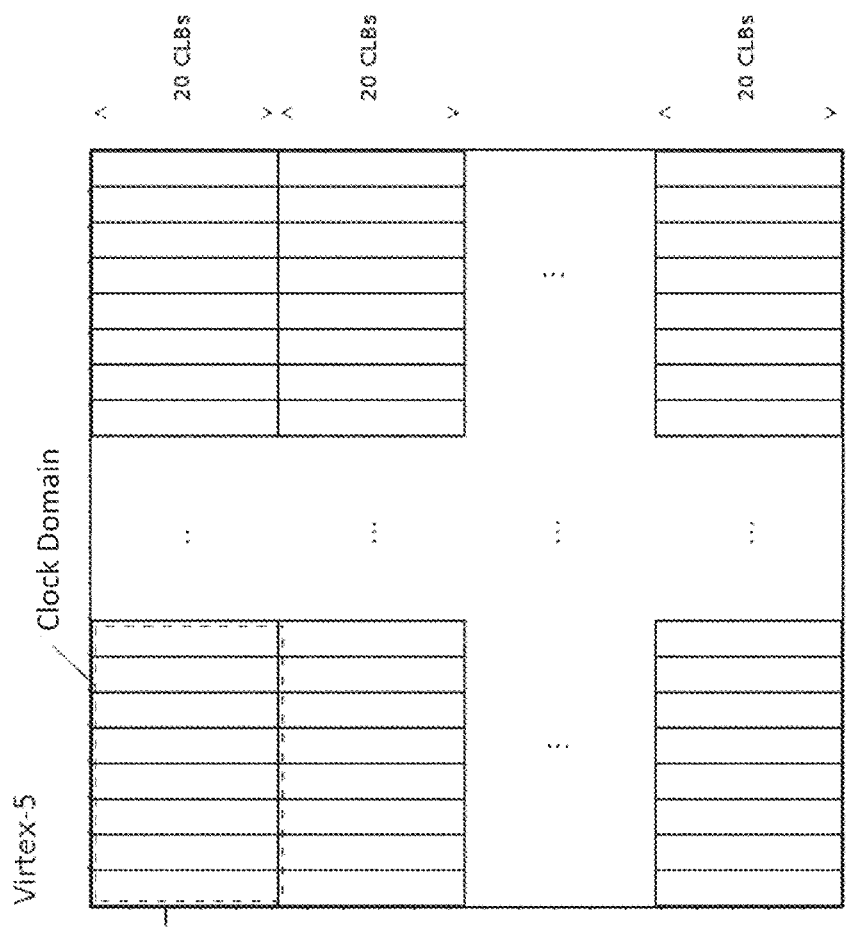
FIG. 5 shows a detailed view of the organization of FPGA configuration memory of FIG. 2 in readback columns.

The method further comprises optimizing the FPGA hardware configuration 24 in a readback column of the FPGA 5 with the arrangement of memory locations 9 which include the status data for a signal value. The organization of the configuration memory 8 in read back columns is shown in FIG. 5. A frame comprises a 1-bit wide and 1312-bit long column in the configuration memory 8 and covers a CLB column of functional level 6. A correlation between a bit within a frame and the functional element that configures it can be determined by the Xilinx tools. Thus, for determining a signal value only a part of a frame is of interest. By positioning in a readback column, access to the status data for a signal value is accelerated. By arranging all memory locations 9 for a signal value within one readback column, these can be accessed by one operation. In an embodiment, signal values that are not changed during FPGA 5 runtime are arranged in readback columns separately from FPGA configurations which can change at runtime.

Figure 6:
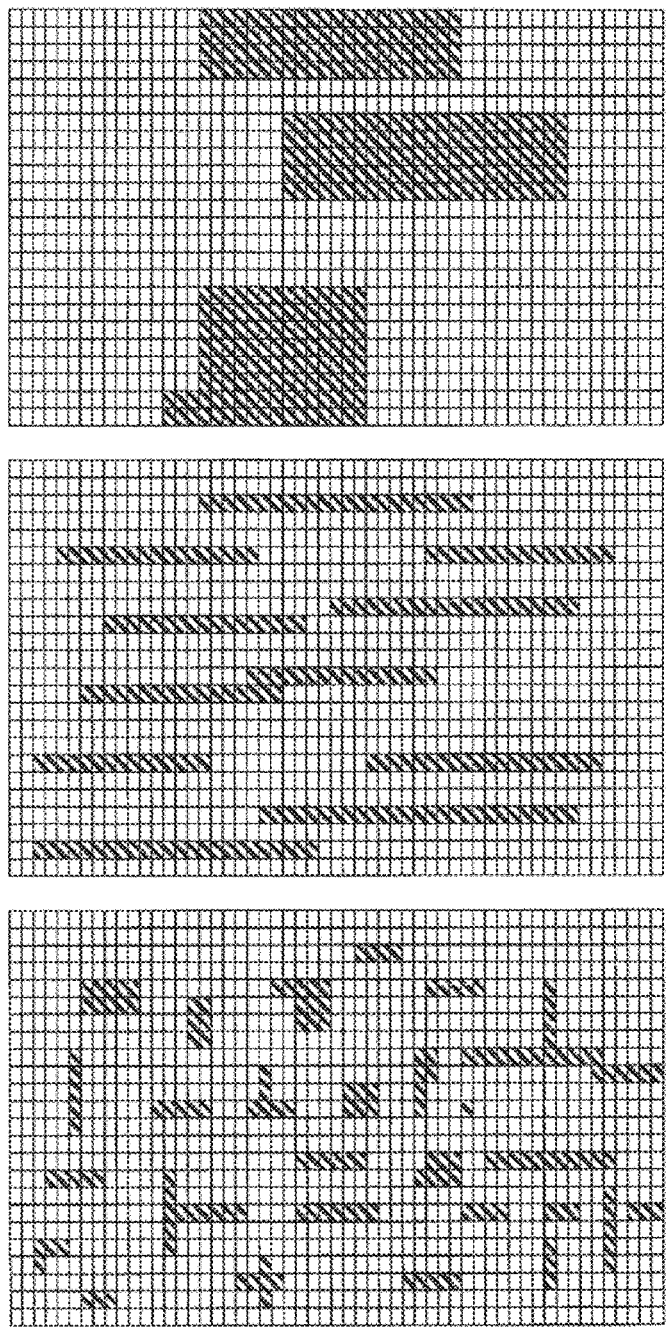
FIG. 6 is a schematic representation of relevant memory contents in readback columns of configuration memory, wherein the left illustration shows a distribution without optimization, the middle illustration shows an optimization with a concentration of relevant memory locations in readback columns, and the illustration on the right shows an optimization with an adjacent array of relevant readback columns.

As shown in FIG. 6, left panel, relevant readback columns are initially distributed over the entire configuration memory 8. By optimizing the FPGA hardware configuration 24, the memory locations 9 which include the states for a signal value are arranged in adjacent portions of the FPGA 5.

Figure 7:
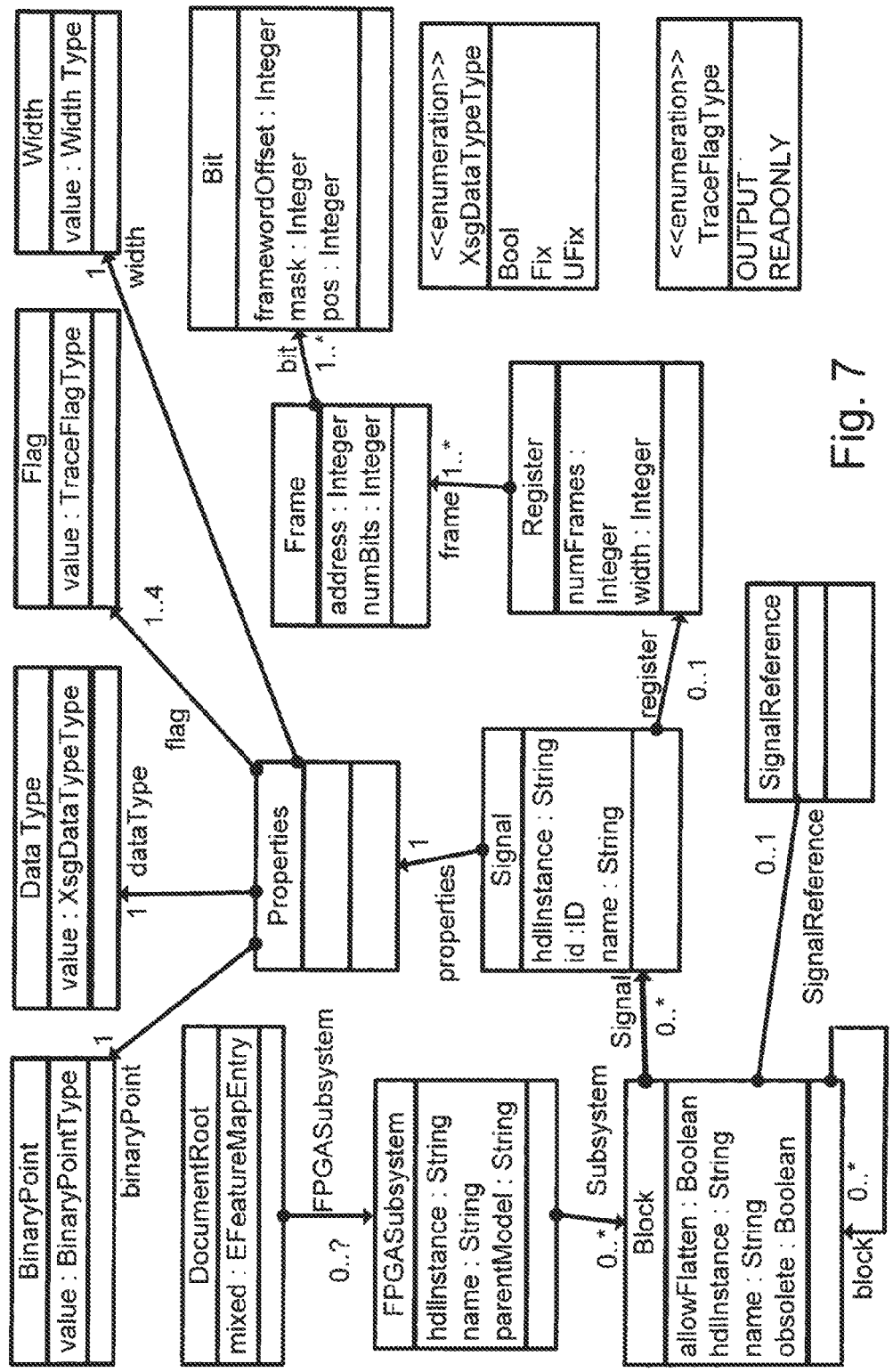
FIG. 7 is a diagram for an XML model.

Adjacent areas may relate to a single readback column of the FPGA 5 or to a plurality of adjacent readback columns. With the adjacent arrangement of memory locations 9 for two signal values within a readback column both signal values are accessed with one operation. FIG. 6, middle panel, shows an optimization with a concentration of relevant memory locations 9 in a reduced number of readback columns. Per FIG. 6, right panel, in a further optimization the relevant readback columns are positioned adjacently in the FPGA 5. A scheme for an XML model 70 which contains the relevant information of the signals, is shown by the model in FIG. 7.

An element of the type FPGA subsystem forms the root of each readback model instance. The FPGA subsystem recursively includes further sub-instances modeled after the hierarchy of Simulink. A subsystem in this context can be implemented both as a primitive block (e.g. adder) as well as a Simulink subsystem. A name of a subsystem or block and the name of the associated HDL entity are stored in the properties name or HDL-Instance of the subsystem class.

Each subsystem may include multiple signals which represent signals or I/O ports in the Simulink model. Each signal receives a unique identifier via the ID property. Since the direction of the signals (in/out) does not matter and redundancies in the modeling should be avoided, the signal class represents the outputs of the blocks or subsystems in the Simulink model by convention. Should several subsystems share the same signals, it is possible to reference to signals of other sub-instances via an instance of the signal reference class.

A signal may be associated with a register 60 via the synthesis. This association is also found between the signal class and register class. The relationship between a register 60 and the frames in which the initial values of the register 60 are stored is modeled via the respective classes. The characteristics of a signal are modeled via the properties class. For the readback and subsequent processing of the signals, especially the characteristics binary point, data type and width are relevant.

A register element is associated with several bits via the frame class. Just like the signal, the register 60 has its own width property since the width of a signal and the width of the associated register 60 may vary under certain circumstances. Via the bit position (pos), a bit first identifies the bit of register 60. A bit instance also includes information in regards to on which word (framewordOffset) the register bit is located within the frame, and with what bit mask the value of the bit can be masked out from the frame word.

The readback model is stored in an XML file. In this way, the model can be edited, for example, in a tool extensive manner. The model is supported syntactically and structurally correct by validating against an XSD schema.

The method comprises the additional step of generating an FPGA code 44 as a readback application for determining a signal value, wherein the FPGA code 44 includes the read out of the status data from the configuration memory 8 as readback data and the determination of the signal value from the readback data based on the FPGA variable mapping file 13.

The method comprises the additional step of generating an FPGA code 44 as a writeback application for changing a signal value, wherein the FPGA code 44 includes the determination of the writeback data from the signal value and the writing of the writeback data as status data into the configuration memory 8 of the FPGA 5 based on the FPGA variable mapping file 13. Details are described below particularly with reference to FIG. 11.

Figure 8:
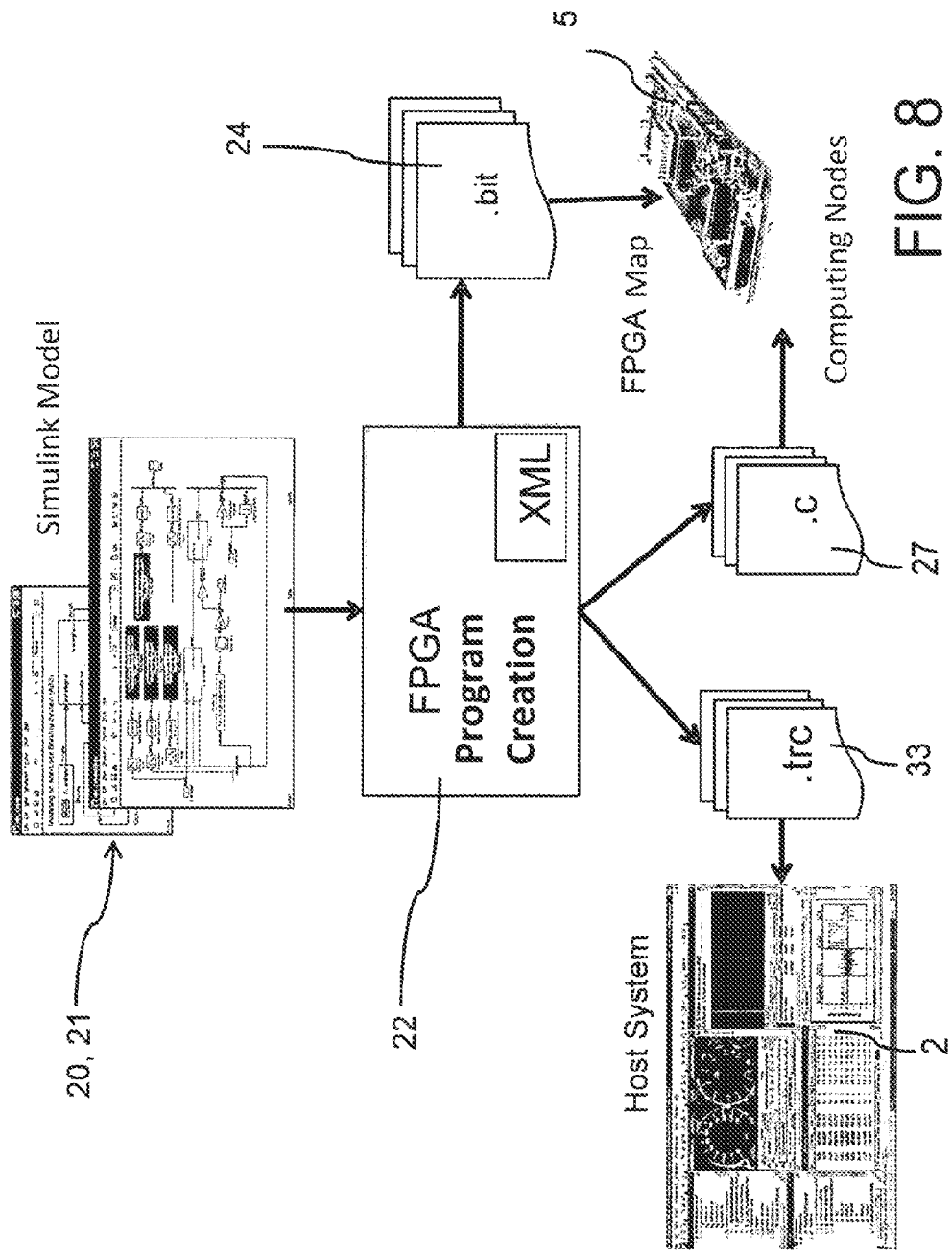
FIG. 8 shows a distribution of the results of the build method of FIG. 3 on the various components of the data processing system from FIG. 1.
Figure 10:
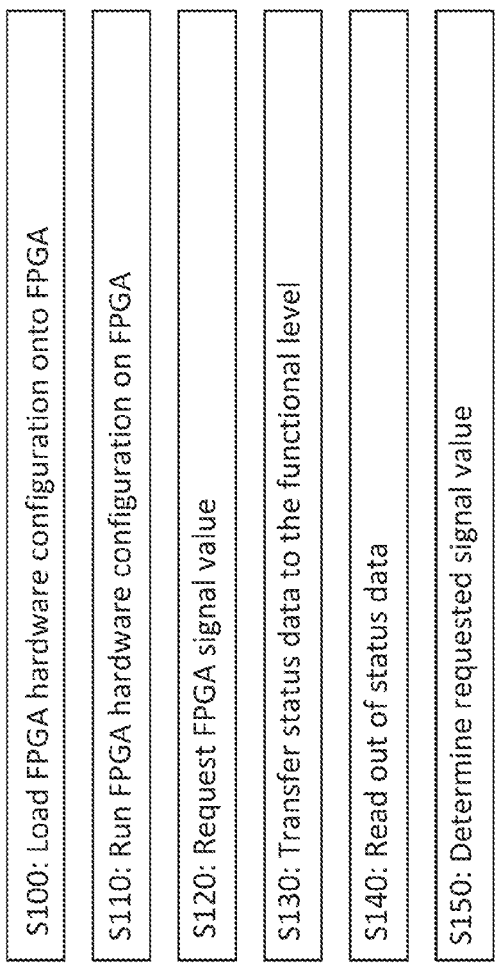
FIG. 10 is a flowchart of a method for access to a signal value of an FPGA according to an embodiment.

FIG. 8 shows the distribution of results of the build method onto the various components. From the Simulink model 20, 21, a build is performed with an FPGA build 22. An FPGA hardware configuration 24 is generated and loaded onto the FPGA 5. This corresponds to step S100 in the described method with reference to FIG. 10. The application 27 is loaded onto the computation node 4, and the full trace file 33 is transferred to the control computer 2.

During operation, the FPGA hardware configuration 24 is started and run on the FPGA 5. This corresponds to step S110 in the described method with reference to FIG. 10. The application 27 is started and run on the computation node 4. A control software 50 is started on the control computer 2, which in this embodiment is a dSPACE ControlDesk software. The ControlDesk 50 communicates with the real-time system 3 via the computation node 4, as shown in FIG. 1.

To display a signal value of the FPGA 5 during runtime, it can be requested via the ControlDesk 50. This corresponds to step S120 in the described method with reference to FIG. 10. Access to different signal values takes place via the full trace file 33 and graphical modeling with Simulink. The signal value is represented as a graph, wherein the signal value is dragged from a list via "drag and drop" onto the illustrated instruments for displaying signal values. The signal value from the list is identified based on a unique identification number.

The signal value is requested by the ControlDesk 50 from the computation node 4. For this purpose, a data acquisition service 51 is implemented on the computation node 4 that receives the request from the ControlDesk 50. The data acquisition service 51 requests the signal value from the controller 12 for the FPGA 5. During operation of the FPGA 5, the signal value initiates the transfer of status data from the functional level 6 of the FPGA 5 into its configuration memory 8. This corresponds to step S130 in the described method with reference to FIG. 10. In this way, during operation and via a trigger all register contents of the functional level 6 are mirrored in the configuration level 7. In an alternative embodiment, components of the status data required for determining the signal value are identified from the FPGA variable mapping file 13 and only those components are secured in the configuration memory 8.

Next, status data from the configuration memory 8 is read as readback data in the FPGA 5 by the readback application 44. This corresponds to step S140 in the described method with reference to FIG. 10. The read out readback data here includes one or more frames, i.e. one or more readback columns of the FPGA 5. For this purpose, first readback columns required for determining the signal value are determined and only these readback columns are read out. This information on the necessary readback columns need to be determined via the FPGA variable mapping file 13. Based on the readback data, the signal value is determined in the FPGA 5. This corresponds to step S150 in the described method with reference to FIG. 10. For this purpose, register values are sought from the frames and extracted. The information arises from the FPGA variable mapping file 13. Mapping of the readback data onto at least one register value takes place. The signal value is thereby formed as necessary from the status data of multiple registers 60. Accordingly, the contents of the registers 60 are processed together in accordance with the FPGA variable mapping files 13 to determine the signal value.

The signal thus determined value is transferred via the interface 11 of the FPGA 5 to the controller 12, which transmits the signal value via the data acquisition service 51 of the computation node 4 to the ControlDesk 50 of the control computer 2.

Figure 9:
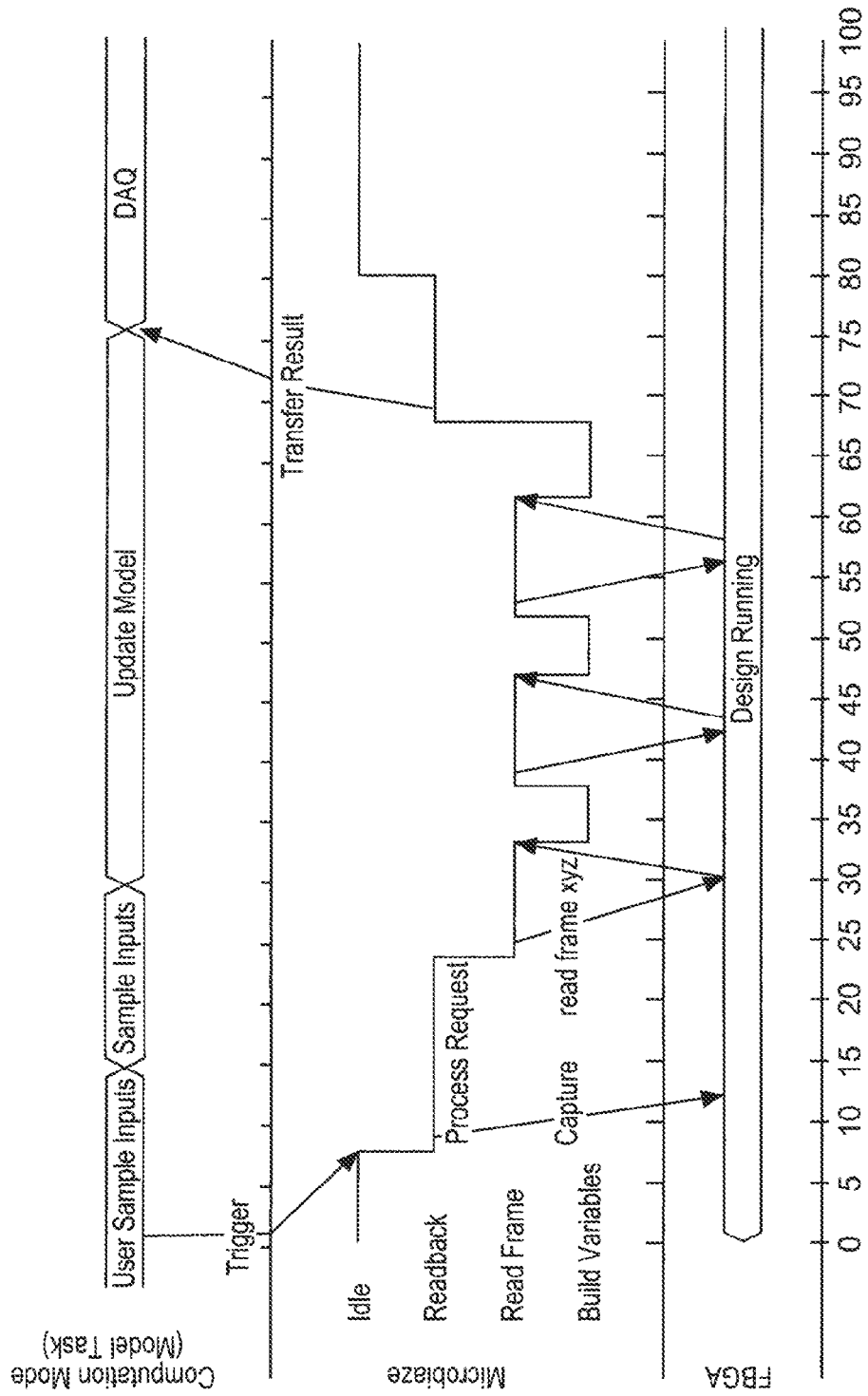
FIG. 9 is a time chart for transferring status data of the FPGA to a requesting computer.

A time chart for transferring status data from the functional level of the FPGA to a requesting computer is shown in FIG. 9.

Figure 11:
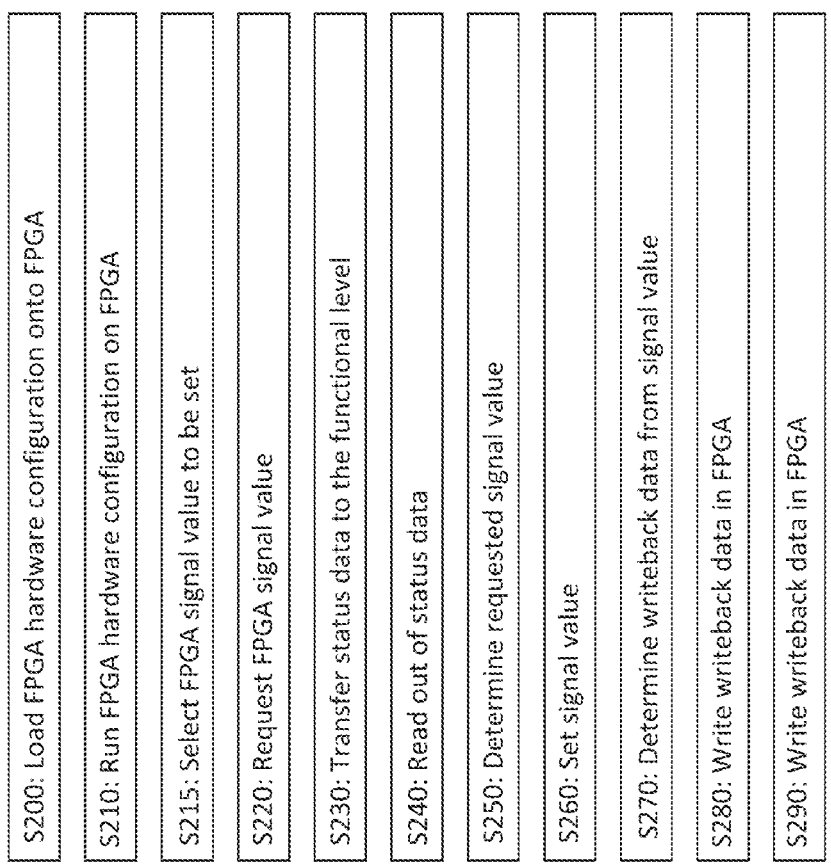
FIG. 11 is a flow chart of a method for changing a signal value of an FPGA according to an embodiment.

By analogy with the previously described read access to a signal value of the FPGA 5, a write access for changing a signal value of the FPGA 5 is also possible, which is described below with reference to FIG. 11.

The procedure for changing a signal value of the FPGA 5 begins in step S200 with the loading of an FPGA hardware configuration 24 onto the FPGA 5. Step S200 corresponds to step S100 described above. In accordance with the previously described step S110, the FPGA hardware configuration 24 is started and performed on the FPGA 5 in step S210. In step S215, an FPGA signal value to be set is selected. As a basis for changing the FPGA signal value, a signal value is read out of the functional level 6 of the FPGA 5 in steps S220 to S250 in accordance with the respective steps S120 to S150 described above.

In step S260, the signal value is set. For this purpose, a user is first shown the read out signal value after which the user then sets a new value for the signal value.

In step S270 writeback data is determined from the signal value. The determination of the writeback data follows based on the principles of the determination of the signal value from the readback data previously described with reference to step S150. Accordingly, the signal value is mapped to the writeback data for one or more registers 60. The changes resulting from the change of the signal value are performed in the status data previously transferred in step S230.

In step S280, the writeback data is written as status data into the configuration memory 8 of the FPGA. The writing of the writeback data into the configuration memory 8 is performed based on the principles of the reading out of status data previously described with reference to step S140. Accordingly, all status data of the area that contains the configuration of the signal value in the functional level 6 is mirrored there.

In step S290, the writeback data from the configuration memory 8 is transferred into the functional level 6 of the FPGA 5. The transfer of the writeback data into the configuration memory 8 is carried out based on the principles of the transfer of status data into functional level 6 previously described with reference to step S130.

In the following, different implementations of signal values with reference to FIGS. 12 to 15 are described.

In FIG. 12, the implementation of a signal value via register 60 is shown in accordance with an embodiment. Each individual bit of the signal value is thereby represented by a register 60. The registers 60 serve as an entity to determine the relevant areas in the configuration flow of the FPGA (bit stream) that need to be changed at runtime according to the desired signal values. Thus, the registers 60 need to feature no inputs. A connection to the system clock can also be optionally implemented. During implementation, it must be ensured that the respective signal value is implemented in the form of a register 60. Alternatively, it is possible to replace the signal value in the hardware description, i.e. the VHDL description, of the design with the corresponding register macros. After the implementation of the initial FPGA design, the exact address of each register bit of all signal values in the FPGA bit stream can be determined using the report files, i.e. the logic allocation file 23. After the initial data stream loading and operation, a signal value can be changed during runtime, in that the respective values of the register 60 are changed through partial reconfiguration. Subsequently, a reset signal is set so that the new value of the signal value is activated for all modified registers 60.

The resource requirements are limited in the use of registers 60 to one register 60 per bit of the signal value to be adjusted. The registers 60 which are required to represent the signal value will no longer be available to the user. The additional reset network only marginally influences the routing options of the remaining FPGA designs due to the use of a dedicated global reset net in the FPGA 5. The determination of components of the configuration of the FPGA data stream 5, which have to be manipulated to change a signal value, can be readily determined.

In FIG. 13, the implementation of a signal value is shown according to an alternative embodiment by the individual bits being represented by outputs of a look-up table 61 (LUT). Each FPGA processing unit (CLB) includes several look-up tables 61, which are normally used to implement arbitrary logic functions. Here, the look-up tables 61 are used as a source of the signal values whose logic function can be changed at runtime through partial reconfiguration.

During implementation, it needs to be ensured in the VHDL description that a corresponding number of LUT macros are instantiated for each of the signal values. After the FPGA implementation process, it needs to be determined which part of the configuration data stream needs to be manipulated to manipulate the contents of the Look-Up Tables 61. During runtime the signal value is then changed by determining corresponding areas in the configuration data stream of the FPGA 5 and altering these through partial reconfiguration.

In FIG. 14, the implementation of a signal value is illustrated by the multiplexer 62 in accordance with a further alternative embodiment. A bit of the signal value is implemented as output of the multiplexer 62. The two inputs of the multiplexer 62 are connected to 0 (S1) and 1 (S2). A selector (C) of the multiplexer 62 is controlled via a bit of the FPGA configuration in order to switch between the inputs of the multiplexer 62. During implementation it must be ensured that the signal value is implemented in the form of a multiplexer 62 and after the implementation it must be known where in the configuration stream the multiplexer 62 can again be located. During runtime, the signal value is changed in that the corresponding area in the configuration data stream of the FPGA 5 is determined and changed through partial reconfiguration.

In comparison with the representation of the signal value by register 60 or look-up tables 61, few logic resources are used during implementation of a signal value with multiplexer 62.

In FIG. 15, the implementation of a signal value in accordance with a further embodiment is shown by routing to VCC/GND. This is a particularly resource-efficient way of implementing a signal value. In the switch box 63, every bit of the signal value is wired to a 0 or 1 connector as long as no influence is exerted on the implementation in the form of constraints. During runtime through partial reconfiguration within the switch box 63, the routing of the individual bits of the signal value can be changed in such a way that the original 1, shown by a solid line, turns into a 0, represented by a broken line, or vice versa.

During operation, the relevant shares in the FPGA 5 can be overwritten through partial reconfiguration of the FPGA 5. The signal value, here a Simulink constant block, is mapped to the reconfigurable look-up table 61, a register 60 or a multiplexer 62. Subsequently, the signal value is changed via partial, dynamic reconfiguration to an arbitrary value.

The method is implemented as a computer program product with computer-implemented prompts which performs the steps of the above process according to the loading and running in the real-time system 3.

A digital storage medium provides electronically readable control signals which interact with the real-time system 3 in such a way that the above method is performed on the real-time system 3.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for changing a signal value of an FPGA at runtime, the method comprising:
loading an FPGA hardware configuration with at least one signal value onto the FPGA;
running the FPGA hardware configuration on the FPGA;
selecting at least one of the at least one signal value for transfer onto the FPGA on a control computer;
determining writeback data from the at least one signal value retrieved from the FPGA by the control computer;
writing the writeback data as status data in a configuration memory of the FPGA; and
transferring the status data from the configuration memory into a functional level of the FPGA as at least one altered signal value replacing the at least one signal value in the FPGA.

2. The method according to claim 1, further comprising: before transferring the status data from the configuration memory into the functional level of the FPGA, transferring status data from the functional level of the FPGA into the configuration memory in a configuration level of the configuration memory.

3. The method according to claim 1, wherein the step of determining the writeback data from the signal value includes the mapping of the signal value onto the writeback data.

4. The method according to claim 1, wherein the step of writing the writeback data as the status data into the configuration memory of the FPGA includes determining areas of the configuration memory that are required for the change of the signal value and writing the status data of the required areas of the configuration memory as writeback data.

5. The method according to claim 4, wherein the step of determination of areas of the configuration memory required to change the signal value, includes identification of respective areas via an identification number.

6. The method according to claim 1, wherein the step of transferring the status data from the configuration memory into the functional plane of the FPGA includes determining components of the functional level of the FPGA necessary to write status data and transferring these components of status data into the functional level.

7. The method according to claim 6, wherein the step of determination of components of the functional level of the FPGA, necessary for writing the status data, includes identification of components via an identification number.

8. The method according to claim 7, wherein the step of determination of areas of the configuration memory required to change the signal value, includes identification of respective areas via an identification number.

9. The method according to claim 1, wherein the step of selecting the signal value for transfer to the FPGA comprises providing a list of available signal values and the selection of a signal value from this list.

10. The method according to claim 1, wherein the step of running the FPGA Hardware Configuration on the FPGA includes performing the hardware configuration as a real-time application, and wherein the method for changing a signal value of an FPGA is performed at runtime of the real-time application.

11. The method according to claim 1, wherein the step of transferring the status data from the configuration memory into the functional level of the FPGA comprises sending a reset signal to the FPGA.

12. The method according to claim 11, wherein the step of sending a reset signal to the FPGA includes sending a reset signal for the partial transfer of the status data from the configuration memory into the functional level of the FPGA.

13. The method according to claim 1, the method further comprising:
creating the FPGA hardware configuration having at least two signal values, wherein memory locations of the status data of the signal values are adjacent to each other in the configuration memory;
determining memory locations in the configuration memory for the status data of the signal values based on the FPGA hardware configuration; and
creating a list of signal values accessible and/or changeable at runtime and of the memory locations of the signal values.

14. The method according to claim 13, wherein the method further comprises implementing a reset signal for transferring status data from the configuration memory into the functional level of the FPGA, and wherein transfer of status data from the configuration memory into the functional level of the FPGA comprises a partial transfer of the status data from adjacent memory locations of the FPGA hardware configuration with the signal values.

15. A data processing device with a processor unit and an FPGA, wherein the data processing device performs the method according to claim 1.

16. A computer program product with computer-implemented prompts which after loading and running in a suitable data processing device performs the steps of the method according to claim 1.

17. A digital storage medium with electronically readable control signals that are capable of cooperating with a data processing device such that the method is performed according to claim 1 on the data processing device.

* * * * *